United States Patent
Kakiuchi

(10) Patent No.: US 10,727,392 B2
(45) Date of Patent: *Jul. 28, 2020

(54) LIQUID EJECTION APPARATUS

(71) Applicant: BROTHER KOGYO KABUSHIKI KAISHA, Nagoya-shi, Aichi-ken (JP)

(72) Inventor: Toru Kakiuchi, Aichi-ken (JP)

(73) Assignee: BROTHER KOGYO KABUSHIKI KAISHA, Nagoya-Shi, Aichi-Ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/257,252

(22) Filed: Jan. 25, 2019

(65) Prior Publication Data

US 2019/0157541 A1 May 23, 2019

Related U.S. Application Data

(63) Continuation of application No. 16/055,291, filed on Aug. 6, 2018, now Pat. No. 10,236,434, which is a (Continued)

(30) Foreign Application Priority Data

Sep. 28, 2016 (JP) .................................. 2016-18997

(51) Int. Cl.
*B41J 2/14* (2006.01)
*H01L 41/047* (2006.01)
(Continued)

(52) U.S. Cl.
CPC ...... *H01L 41/0475* (2013.01); *B41J 2/14072* (2013.01); *B41J 2/14233* (2013.01);
(Continued)

(58) Field of Classification Search
CPC .............. B41J 2/14072; B41J 2/14233; B41J 2/17526; B41J 2002/14191; H05K 3/321;
(Continued)

(56) References Cited

U.S. PATENT DOCUMENTS 5,459,500 A   10/1995  Morris et al.
6,241,340 B1   6/2001  Watanabe et al.
(Continued)

FOREIGN PATENT DOCUMENTS

CN   101779255 A   7/2010
CN   104512114 A   4/2015
(Continued)

OTHER PUBLICATIONS

Office Action issued in related European Patent Application No. 17 163 954.5, dated Feb. 5, 2019.
(Continued)

*Primary Examiner* — Juanita D Jackson

(74) *Attorney, Agent, or Firm* — Merchant & Gould P.C.

(57) ABSTRACT

An actuator device includes: an actuator including a first contact; and a wire member including a second contact connected to the first contact with a conductive adhesive including a conductive particle. One of the first contact and the second contact is a particular contact. The other of the first contact and the second contact is a specific contact. At least two protrusions and at least one recess are formed on and in the particular contact. The at least two protrusions are arranged in a first direction. The at least one recess is interposed between the at least two protrusions. The particular contact is joined to the specific contact with the conductive adhesive provided in the at least one recess, in a state in which each of the at least two protrusions is in contact with the specific contact.

18 Claims, 15 Drawing Sheets

Related U.S. Application Data continuation of application No. 15/472,056, filed on Mar. 28, 2017, now Pat. No. 10,069,058.

(51) Int. Cl.
  *B41J 2/175* (2006.01)
  *B41J 2/16* (2006.01)
  *H05K 3/32* (2006.01)
  *H05K 3/36* (2006.01)
  *H01L 41/09* (2006.01)

(52) U.S. Cl.
  CPC ............ *B41J 2/161* (2013.01); *B41J 2/1623* (2013.01); *B41J 2/1626* (2013.01); *B41J 2/1643* (2013.01); *B41J 2/1753* (2013.01); *B41J 2/17526* (2013.01); *H01L 41/0973* (2013.01); *H05K 3/321* (2013.01); *H05K 3/361* (2013.01); *B41J 2002/14491* (2013.01); *H05K 2201/0233* (2013.01); *H05K 2201/09745* (2013.01); *H05K 2203/0278* (2013.01)

(58) Field of Classification Search
  CPC ............ H05K 3/361; H05K 2201/097; H05K 2203/0278
  See application file for complete search history.

(56) References Cited

U.S. PATENT DOCUMENTS

| | | | |
|---|---|---|---|
| 9,238,364 | B2 | 1/2016 | Kondo |
| 10,236,434 | B2* | 3/2019 | Kakiuchi ............ H01L 41/0475 |
| 2010/0288328 | A1 | 11/2010 | Fukushima et al. |
| 2012/0086759 | A1 | 4/2012 | Takada |
| 2015/0091983 | A1 | 4/2015 | Kakiuchi et al. |
| 2016/0067969 | A1 | 3/2016 | Kakiuchi et al. |

FOREIGN PATENT DOCUMENTS

| | | |
|---|---|---|
| CN | 105398220 A | 3/2016 |
| EP | 0 562 308 A2 | 9/1993 |
| EP | 2 690 671 A1 | 1/2014 |
| JP | 06-23996 A | 2/1994 |
| JP | 2001-347657 A | 12/2001 |
| JP | 2007-214533 A | 8/2007 |
| JP | 2012-81639 A | 4/2012 |
| JP | 2012-222025 A | 11/2012 |
| JP | 2014-151623 A | 8/2014 |

OTHER PUBLICATIONS

Extended European Search Report issued in related European Application No. 17163954.5, dated Nov. 6, 2017.
Notification of First Office Action issued in corresponding Chinese Patent Application No. 201710201016.2, Mar. 27, 2020.

* cited by examiner

WIRE EXTENDING DIRECTION
(SECOND DIRECTION)
LEFT ⟷ RIGHT

CONTACT ARRANGEMENT DIRECTION
(FIRST DIRECTION)
FRONT ⟵⟶ REAR

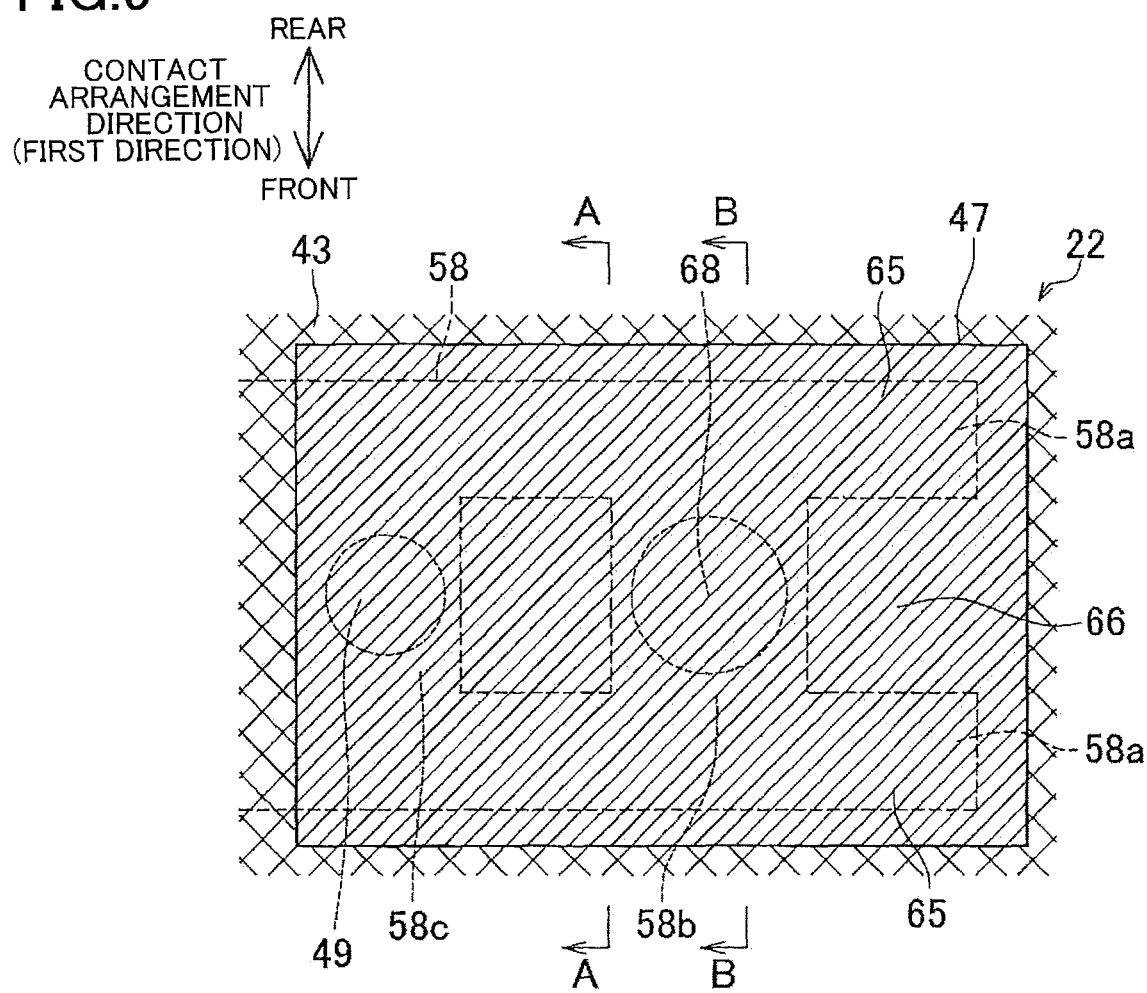

CONTACT ARRANGEMENT DIRECTION
(FIRST DIRECTION)
FRONT ⟵⟶ REAR

CONTACT ARRANGEMENT DIRECTION
(FIRST DIRECTION)
FRONT ⟵⟶ REAR

CONTACT ARRANGEMENT DIRECTION
(FIRST DIRECTION)
FRONT ⟵⟶ REAR

CONTACT ARRANGEMENT DIRECTION
(FIRST DIRECTION)
FRONT ⇔ REAR

LIQUID EJECTION APPARATUS

CROSS REFERENCE TO RELATED APPLICATION

The present application is a continuation of U.S. patent application Ser. No. 16/055,291, filed Aug. 6, 2018, now issued U.S. Pat. No. 10,236,434, which is a continuation of U.S. patent application Ser. No. 15/472,056, filed Mar. 28, 2017, now issued U.S. Pat. No. 10,069,058, which further claims priority from Japanese Patent Application No. 2016-189997, filed on Sep. 28, 2016, the disclosure of all of which is herein incorporated by reference in their entirety.

BACKGROUND

The following disclosure relates to an actuator device, a liquid ejection apparatus, and a connection structure of a wire member.

There is known a charge plate for selectively charging ink to be ejected by an ink-jet head through its orifices. An insulated base of the charge plate is provided with charge electrodes and lead wires corresponding to the respective charge electrodes. Contacts are provided on end portions of the respective lead wires. A wire member including wires (conduction bands) are joined to an end portion of the insulated base on which the contacts provided on the lead wires are disposed.

The wire member and the insulated base of the charge plate are connected to each other with a conductive adhesive formed of an anisotropic conductive material, for example. The conductive adhesive is a thermosetting adhesive containing conductive particles. Portions of the wire member and the insulated base of the charge plate which are to be joined to each other are heated and pressurized in a state in which the conductive adhesive having not been hardened yet is interposed between the wire member and the insulated base of the charge plate. In this process, the contacts provided on the charge plate and the wires provided on the wire member are electrically connected to each other through the conductive particles. Also, the adhesive is hardened by heating, which mechanically joins the wire member to the charge plate.

SUMMARY

In the joining with the conductive adhesive, the contacts of the two components are electrically connected to each other through the conductive particles contained in the thermosetting adhesive. In this process, however, the conductive particles contained in the conductive adhesive in some cases flow out to areas around the contacts together with the adhesive, leading to shorts between adjacent contacts due to the conductive particles having flowed out. Decreased density of the conductive particles may reduce occurrences of the shorts. However, the smaller number of the conductive particles easily causes a situation in which no conductive particles are provided between two contacts, which may lead to poor connection.

Accordingly, an aspect of the disclosure relates to a technique of increasing reliability of electric connection between two contacts without increase in density of conductive particles in connection of the two contacts using a conductive adhesive.

In one aspect of the disclosure, an actuator device includes: an actuator including at least one first contact; and a wire member including at least one second contact respectively connected to the at least one first contact with a conductive adhesive including a conductive particle. One of (i) each of the at least one first contact and (ii) each of the at least one second contact is each of at least one particular contact, and another of (i) each of the at least one first contact and (ii) each of the at least one second contact is each of at least one specific contact. At least two protrusions and at least one recess are formed on and in the at least one particular contact. The at least two protrusions are arranged in a first direction parallel with a placement surface of each of the at least one particular contact. The at least one recess is interposed between the at least two protrusions. The at least one particular contact is respectively joined to the at least one specific contact with the conductive adhesive provided in the at least one recess, in a state in which each of the at least two protrusions is in contact with a corresponding one of the at least one specific contact.

In another aspect of the disclosure, a liquid ejection apparatus includes: a passage definer defining therein at least one pressure chamber; a vibration layer covering the at least one pressure chamber; at least one piezoelectric element disposed on the vibration layer so as to respectively overlap the at least one pressure chamber; at least one first contact respectively drawn from the at least one piezoelectric element; and a wire member including at least one second contact respectively connected to the at least one first contact with a conductive adhesive including a conductive particle. One of (i) each of the at least one first contact and (ii) each of the at least one second contact is each of at least one particular contact, and another of (i) each of the at least one first contact and (ii) each of the at least one second contact is each of at least one specific contact. At least two protrusions and at least one recess are formed on and in the at least one particular contact. The at least two protrusions are arranged in a first direction parallel with a placement surface of each of the at least one particular contact, the at least one recess being interposed between the at least two protrusions. The at least one particular contact is respectively joined to the at least one specific contact with the conductive adhesive provided in the at least one recess, in a state in which each of the at least two protrusions is in contact with a corresponding one of the at least one specific contact.

Yet another aspect of the disclosure relates to a connection structure for connecting at least one first contact and at least one second contact of a wire member respectively to each other with a conductive adhesive. One of (i) each of the at least one first contact and (ii) each of the at least one second contact is each of at least one particular contact. Another of (i) each of the at least one first contact and (ii) each of the at least one second contact is each of at least one specific contact. At least two protrusions and at least one recess are formed on and in the at least one particular contact. The at least two protrusions are arranged in a first direction parallel with a placement surface of each of the at least one particular contact. The at least one recess is interposed between the at least two protrusions. The at least one particular contact is respectively joined to the at least one specific contact with the conductive adhesive provided in the at least one recess, in a state in which each of the at least two protrusions is in contact with a corresponding one of the at least one specific contact.

BRIEF DESCRIPTION OF THE DRAWINGS

The objects, features, advantages, and technical and industrial significance of the present disclosure will be better understood by reading the following detailed description of the embodiment, when considered in connection with the accompanying drawings, in which:

FIG. 9 is a plan view of a ground contact of the piezoelectric actuator;

DETAILED DESCRIPTION OF THE EMBODIMENT

Figure 1:
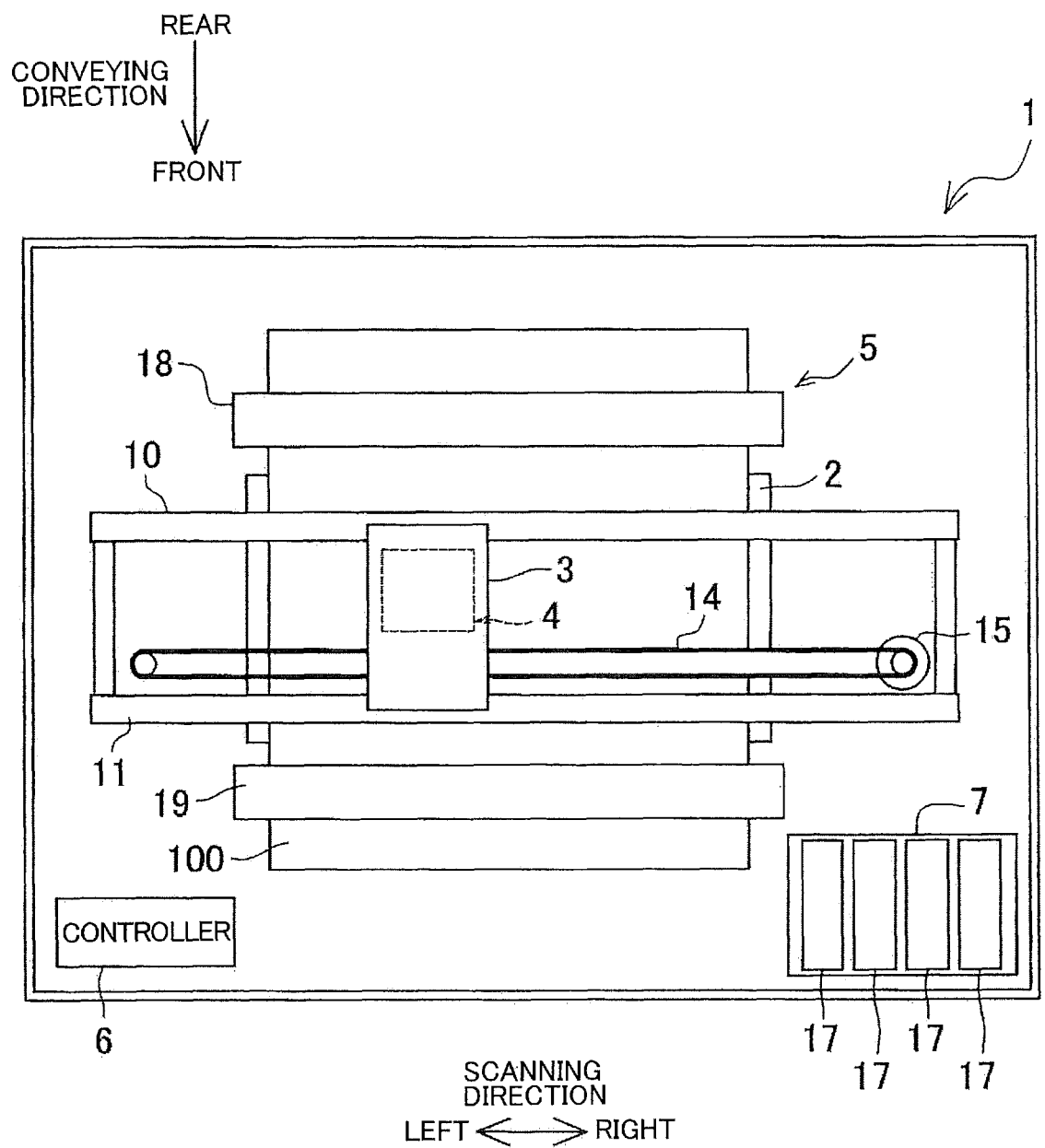
FIG. 1 is a schematic plan view of a printer according to the present embodiment.

Hereinafter, there will be described an embodiment by reference to the drawings. First, there will be explained an overall configuration of an ink-jet printer 1 with reference to FIG. 1. The direction in which a recording sheet 100 is conveyed in FIG. 1 is defined as the front and rear direction of the printer 1. The widthwise direction of the recording sheet 100 is defined as the right and left direction of the printer 1. The direction orthogonal to the front and rear direction and the right and left direction and perpendicular to the sheet surface of FIG. 1 is defined as the up and down direction of the printer 1.

Overall Configuration of Printer

As illustrated in FIG. 1, the ink-jet printer 1 includes a carriage 3, an ink-jet head 4, a conveying mechanism 5, and a controller 6.

The carriage 3 is mounted on guide rails 10, 11 extending in the right and left direction (hereinafter may also be referred to as "scanning direction"). The carriage 3 is joined to a carriage driving motor 15 via an endless belt 14. The carriage 3 is driven by the motor 15 and reciprocated in the scanning direction over the recording sheet 100 conveyed on a platen 2.

The ink-jet head 4 is mounted on the carriage 3. Inks of four colors, namely, black, yellow, cyan, and magenta, are supplied to the ink-jet head 4 respectively via tubes, not illustrated, from four ink cartridges 17 held by a holder 7. While moving in the scanning direction with the carriage 3, the ink-jet head 4 ejects the inks from a multiplicity of nozzles 24 (see FIGS. 2-6) onto the recording sheet 100 conveyed on the platen 2.

The conveying mechanism 5 includes two conveying rollers 18, 19 configured to convey the recording sheet 100 on the platen 2 in the front direction (hereinafter may also be referred to as "conveying direction").

The controller 6 controls devices including the ink-jet head 4 and the carriage driving motor 15 to print an image on the recording sheet 100 based on a print instruction received from an external device such as a personal computer (PC).

Detailed Configuration of Ink-Jet Head

There will be next explained a configuration of the ink-jet head 4 with reference to FIGS. 2-6. It is noted that FIGS. 3 and 4 omit illustration of a protector 23 illustrated in FIG. 2.

In the present embodiment, the ink-jet head 4 ejects the inks of the four colors (black, yellow, cyan, and magenta). As illustrated in FIGS. 2-6, the ink-jet head 4 includes a nozzle plate 20, a passage definer 21, and an actuator device 25 including a piezoelectric actuator 22. In the present embodiment, the actuator device 25 does not indicate only the piezoelectric actuator 22 but includes not only the piezoelectric actuator 22 but also the protector 23 and chip-on-films (COFs) 50 disposed on the piezoelectric actuator 22. Each of the COFs 50 is one example of a wire member.

Nozzle Plate

The nozzle plate 20 is formed of silicon, for example. The nozzle plate 20 has the nozzles 24 arranged in the conveying direction. That is, the front and rear direction coincides with a direction in which the nozzles 24 are arranged (hereinafter also referred to as "nozzle arrangement direction").

Figure 2:
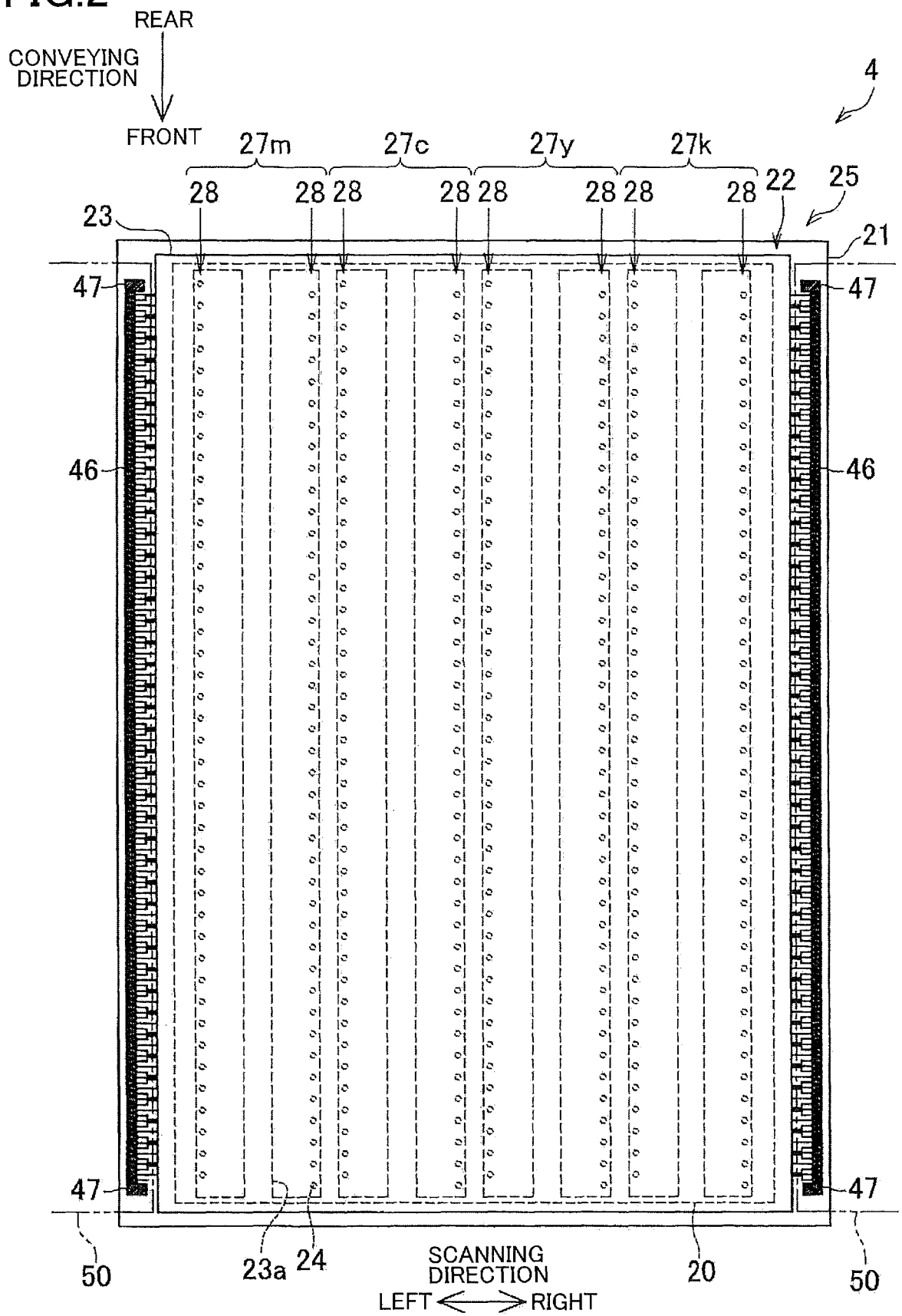
FIG. 2 is a plan view of an ink-jet head.
Figure 3:
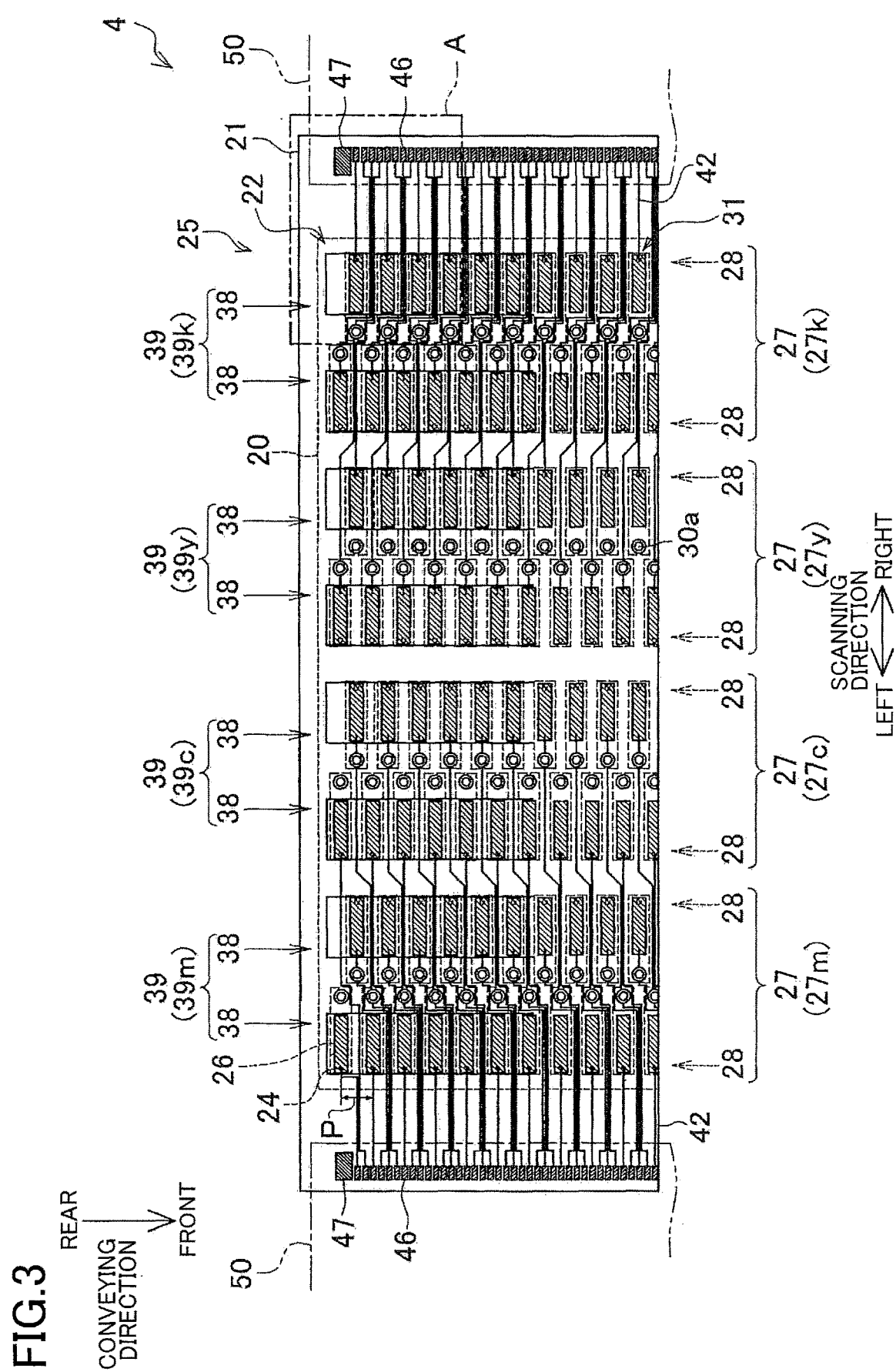
FIG. 3 is an enlarged view of a rear end portion of the ink-jet head in FIG. 2.

More specifically, as illustrated in FIGS. 2 and 3, the nozzle plate 20 has four nozzle groups 27 arranged in the scanning direction. The four nozzle groups 27 are for ejection of the different inks, respectively. Each of the nozzle groups 27 is constituted by right and left nozzle rows 28. In each of the nozzle rows 28, the nozzles 24 are arranged at intervals P. Positions of the nozzles 24 are displaced by P/2 in the conveying direction between the two nozzle rows 28. That is, the nozzles 24 are arranged in two rows in a staggered configuration in each nozzle group 27.

In the following explanation, one of suffixes k, y, c, and m may be selectively added to the reference numbers of components of the ink-jet head 4 to indicate their respective correspondences with one of the black, yellow, cyan, and magenta inks. For example, the wording "nozzle groups 27k" indicates the nozzle group 27 for the black ink.

Passage Definer

The passage definer 21 is a base plate formed of silicon single crystal. As illustrated in FIGS. 3-6, the passage definer 21 has pressure chambers 26 communicating with the respective nozzles 24. Each of the pressure chambers 26 has a rectangular shape elongated in the scanning direction in plan view. The pressure chambers 26 are arranged in the conveying direction so as to correspond to the arrangement of the nozzles 24. The pressure chambers 26 are arranged in eight pressure chamber rows, each two of which correspond to one of the four ink colors. A lower surface of the passage definer 21 is covered with the nozzle plate 20. An outer end portion of each of the pressure chambers 26 in the scanning direction overlaps a corresponding one of the nozzles 24.

A vibration layer 30 of the piezoelectric actuator 22, which will be described below, is disposed on an upper surface of the passage definer 21 so as to cover the pressure chambers 26. The vibration layer 30 is not limited in particular as long as the vibration layer 30 is an insulating layer covering the pressure chambers 26. In the present embodiment, the vibration layer 30 is formed by oxidation or nitriding of a surface of the base plate formed of silicon. The vibration layer 30 has ink supply holes 30a at areas each covering an end portion of a corresponding one of the pressure chambers 26 in the scanning direction (which end portion is located on an opposite side of the pressure chamber 26 from the nozzle 24).

For each ink color, the ink is supplied from a corresponding one of four reservoirs 23b formed in the protector 23 to the pressure chambers 26 through the respective ink supply holes 30a. When ejection energy is applied to the ink in each of the pressure chambers 26 by a corresponding one of piezoelectric elements 31 of the piezoelectric actuator 22 which will be described below, an ink droplet is ejected from the nozzle 24 communicating with the pressure chamber 26.

Actuator Device

The actuator device 25 is disposed on the upper surface of the passage definer 21. The actuator device 25 includes: the piezoelectric actuator 22 including the piezoelectric elements 31; the protector 23; and the two COFs 50.

Figure 4:
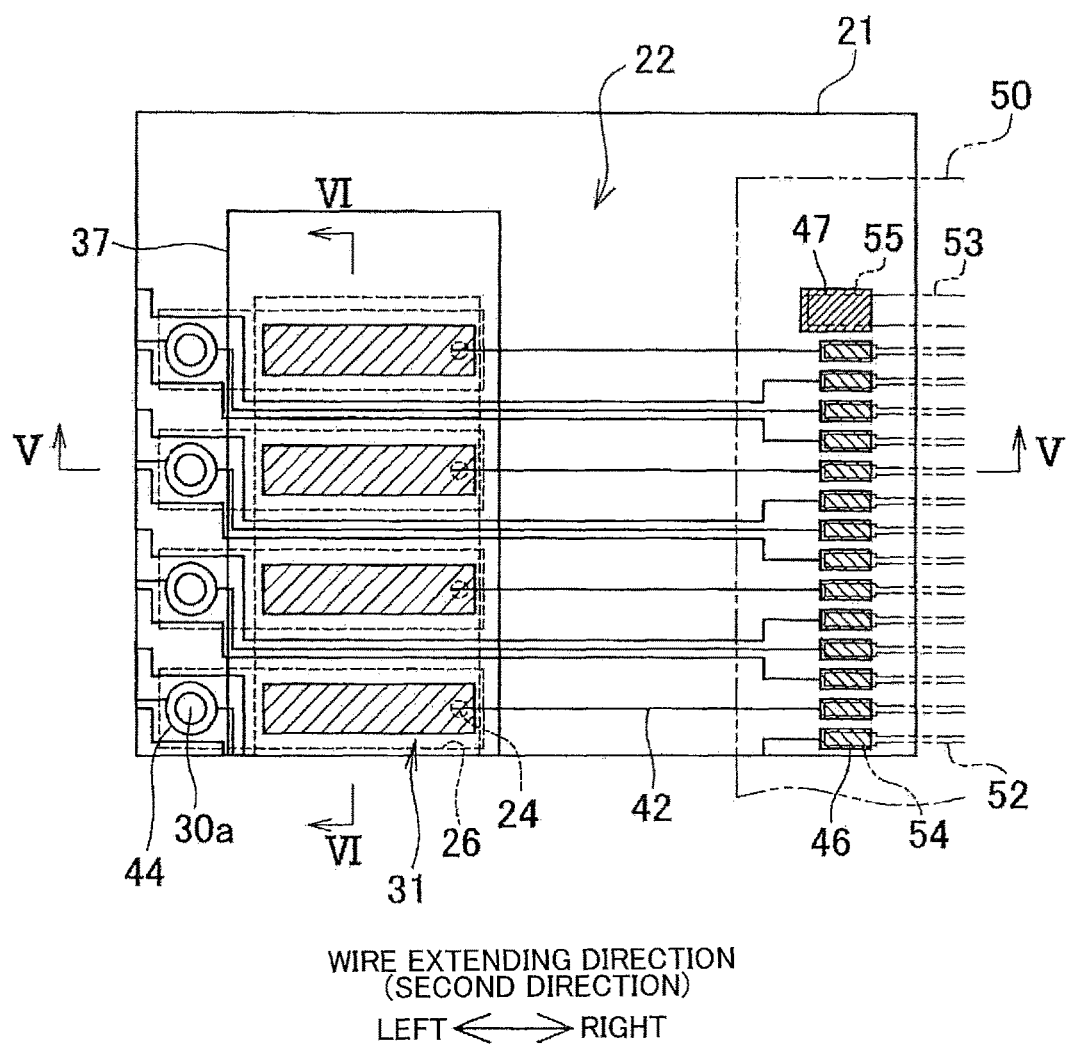
FIG. 4 is an enlarged view of an area A in FIG. 3.

The piezoelectric actuator 22 is disposed on the entire upper surface of the passage definer 21. As illustrated in FIGS. 3 and 4, the piezoelectric actuator 22 includes the piezoelectric elements 31 arranged so as to overlap the respective pressure chambers 26. The piezoelectric elements 31 are arranged in the conveying direction so as to correspond to the arrangement of the pressure chambers 26 and constitute eight piezoelectric element rows 38. A plurality of driving contacts 46 and two ground contacts 47 are drawn out leftward from left four of the piezoelectric element rows 38, and as illustrated in FIGS. 2 and 3 the contacts 46, 47 are disposed on a left end portion of the passage definer 21. A plurality of driving contacts 46 and two ground contacts 47 are drawn out rightward from right four of the piezoelectric element rows 38, and the contacts 46, 47 are disposed on a right end portion of the passage definer 21. The structure of the piezoelectric actuator 22 will be described below in detail.

The protector 23 is disposed on an upper surface of the piezoelectric actuator 22 so as to cover the piezoelectric elements 31. Specifically, the protector 23 includes eight recessed protecting portions 23a respectively covering the eight piezoelectric element rows 38. As illustrated in FIG. 2, the protector 23 does not cover right and left end portions of the piezoelectric actuator 22, so that the driving contacts 46 and the ground contacts 47 are exposed from the protector 23. The protector 23 has the reservoirs 23b connected to the respective ink cartridges 17 held by the holder 7. The ink in each of the reservoirs 23b is supplied to the pressure chambers 26 through respective ink supply passages 23c and the respective ink supply holes 30a formed in the vibration layer 30.

Each of the COFs 50 illustrated in FIGS. 2-5 is a flexible wire (lead) member including a base 56 formed of insulating material such as a polyimide film. A driver IC 51 is mounted on the base 56. One end portions of the respective two COFs 50 are connected to the controller 6 (see FIG. 1) of the printer 1. The other end portions of the respective two COFs 50 are respectively joined to right and left end portions of the piezoelectric actuator 22. As illustrated in FIG. 4, each of the COFs 50 includes ground wires 53 and a plurality of individual wires 52 connected to the respective driver ICs 51. Individual contacts 54 are provided on distal end portions of the respective individual wires 52 and connected to the respective driving contacts 46 of the piezoelectric actuator 22. Ground contacts 55 are provided on distal end portions of the respective ground wires 53 and connected to the respective ground contacts 47 of the piezoelectric actuator 22. Each of the driver ICs 51 outputs a drive signal to a corresponding one of the piezoelectric elements 31 of the piezoelectric actuator 22 via a corresponding one of the individual contacts 54 and a corresponding one of the driving contacts 46. While the two ground contacts 47 are provided for each of the COFs 50 in the present embodiment, the following explanation will be given for one of the ground contacts 47 for simplicity unless otherwise required.

Detailed Structure of Piezoelectric Actuator

The piezoelectric actuator 22 includes: the vibration layer 30 formed on the upper surface of the passage definer 21; and the piezoelectric elements 31 disposed on an upper surface of the vibration layer 30. For simplicity, FIGS. 3 and 4 omit illustration of a protecting layer 40, an insulating layer 41, and a wire protecting layer 43 illustrated in FIGS. 5 and 6.

As illustrated in FIGS. 3-6, the piezoelectric elements 31 are arranged on the upper surface of the vibration layer 30 so as to overlap the respective pressure chambers 26. That is, the piezoelectric elements 31 are arranged in the conveying direction so as to correspond to the arrangement of the pressure chambers 26. As a result, in accordance with the arrangement of the nozzles 24 and the pressure chambers 26, the piezoelectric elements 31 constitute the eight piezoelectric element rows 38, each two of which correspond to one of the four ink colors. It is noted that a group of the piezoelectric elements 31 of the two piezoelectric element rows 38 corresponding to each of the four ink colors will be referred to as "piezoelectric element group 39". As illustrated in FIG. 3, the four piezoelectric element groups 39k, 39y, 39c, 39m respectively corresponding to the four ink colors are arranged in the scanning direction.

Each of the piezoelectric elements 31 includes a first electrode 32, a piezoelectric layer 33, and a second electrode 34 disposed in this order from a lower side over the vibration layer 30.

Figure 5:
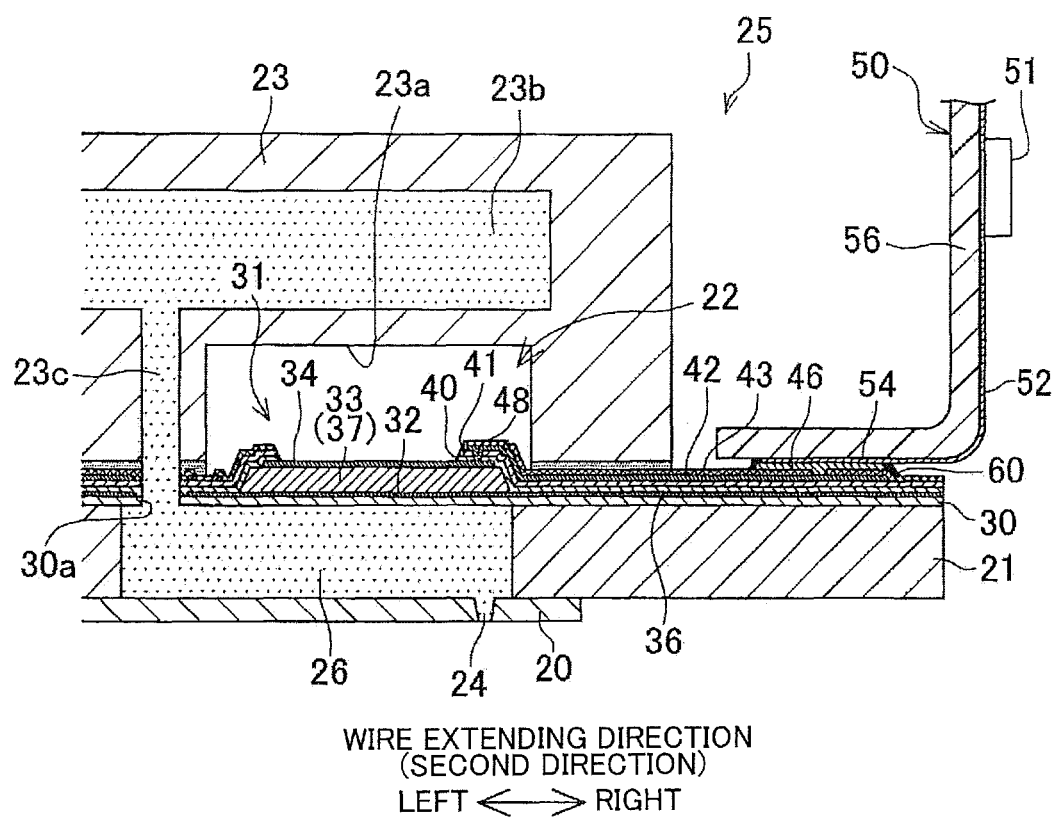
FIG. 5 is a cross-sectional view taken along line V-V in FIG. 4.
Figure 6:
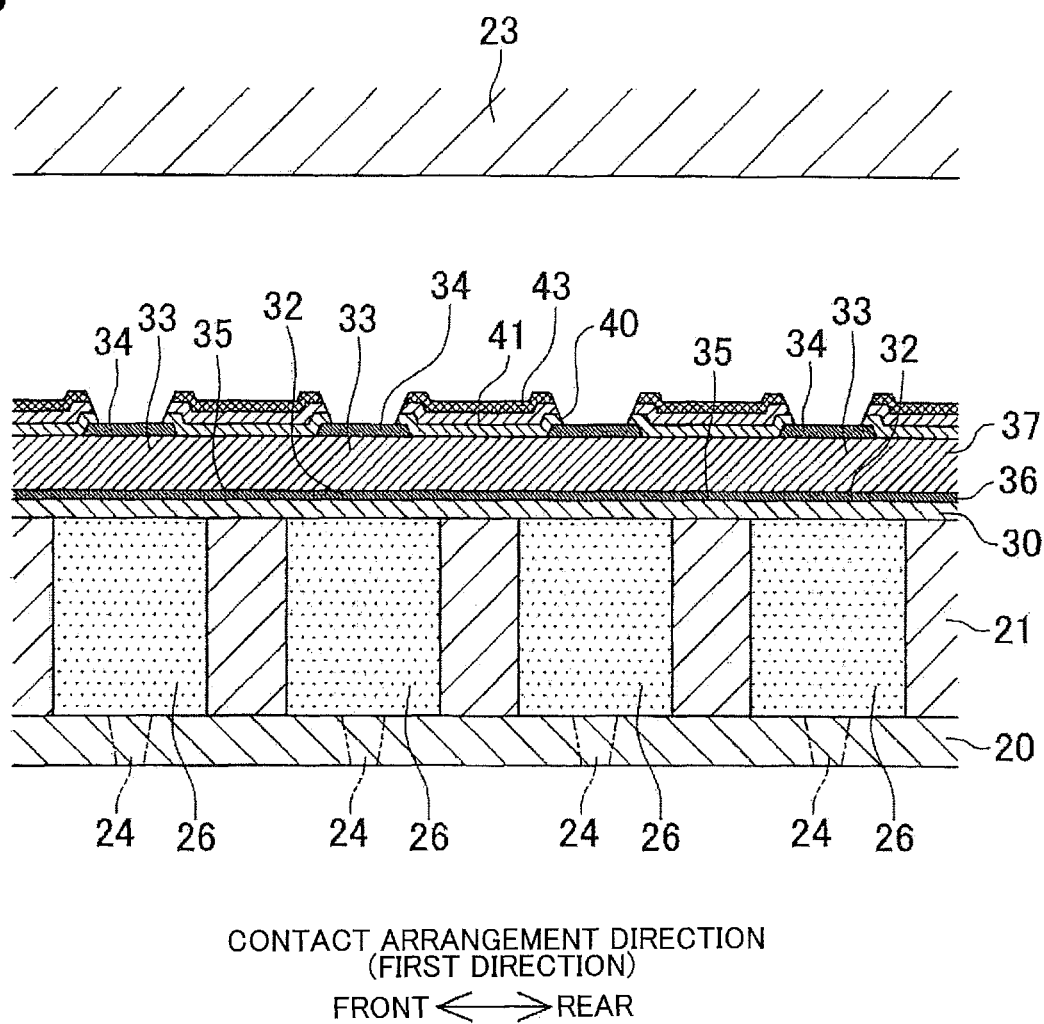
FIG. 6 is a cross-sectional view taken along line VI-VI in FIG. 4.

As illustrated in FIGS. 5 and 6, the first electrode 32 is formed at an area opposed to the pressure chamber 26 formed in the vibration layer 30. As illustrated in FIG. 6, each adjacent two of the first electrodes 32 of the respective piezoelectric elements 31 are connected to each other by an electrically conductive portion 35 disposed between the piezoelectric elements 31. In other words, the first electrodes 32 and the electrically conductive portions 35 connecting the first electrodes 32 to each other constitute a common electrode 36 that covers substantially the entire upper surface of the vibration layer 30. The common electrode 36 is formed of platinum (Pt), for example. The thickness of the common electrode 36 is 0.1 μm, for example. It is noted that the wording "conduct" and "conductive" in the present specification principally means "electrically conduct" and "electrically conductive".

The piezoelectric layer 33 is formed of a piezoelectric material such as lead zirconate titanate (PZT), for example. The piezoelectric layer 33 may be formed of a non-lead piezoelectric material not containing lead. The thickness of the piezoelectric layer 33 is ranged between 1.0 μm and 2.0 μm, for example.

As illustrated in FIGS. 3, 4, and 6, in the present embodiment, the piezoelectric layers 33 of the respective piezoelectric elements 31 are connected to each other in the conveying direction to form a rectangular piezoelectric member 37 elongated in the conveying direction. That is, the eight piezoelectric members 37 constituted by the piezoelectric layers 33 respectively corresponding to the eight pressure chamber rows are disposed on the common electrode 36 covering the vibration layer 30.

The second electrodes 34 are disposed on upper surfaces of the respective piezoelectric layers 33. Each of the second electrodes 34 has a rectangular shape in plan view which is one size smaller than each of the pressure chambers 26. The second electrodes 34 respectively overlap central portions of the respective pressure chambers 26. Unlike the first electrodes 32, the second electrodes 34 of the respective piezoelectric elements 31 are separated and spaced apart from each other. That is, the second electrodes 34 are individual electrodes provided for individually for the respective piezoelectric elements 31. The second electrodes 34 are formed of iridium (Ir) or platinum (Pt), for example. The thickness of each of the second electrodes 34 is 0.1 μm, for example.

As illustrated in FIGS. 5 and 6, the piezoelectric actuator 22 includes the protecting layer 40, the insulating layer 41, wires 42, and the wire protecting layer 43.

As illustrated in FIG. 5, the protecting layer 40 is disposed so as to cover a surface of the piezoelectric member 37 except central portions of the respective second electrodes 34. One of main purposes of the protecting layer 40 is preventing ingress of water from air into the piezoelectric layers 33. The protecting layer 40 is formed of a material having low permeability such as oxides and nitrides, for example. Examples of the oxides include alumina (Al2O3), silicon oxide (SiOx), and tantalum oxide (TaOx). Examples of the nitrides include silicon nitride (SiN).

The insulating layer 41 is formed on an upper side of the protecting layer 40. A material of the insulating layer 41 is not limited in particular. For example, the insulating layer 41 is formed of silicon dioxide (SiO2). This insulating layer 41 is provided for increasing insulation between the common electrode 36 and the wires 42 connected to the respective second electrodes 34.

The wires 42 are formed on the insulating layer 41. The wires 42 are drawn out from the respective second electrodes 34 of the piezoelectric elements 31. Each of the wires 42 is formed of aluminum (Al), for example. As illustrated in FIG. 5, one end portion of each of the wires 42 is disposed so as to overlap an end portion of the second electrode 34 disposed on a corresponding one of the piezoelectric layers 33. Each of the wires 42 is conductive with the corresponding second electrode 34 by a through electrically-conductive portion 48 that extends through the protecting layer 40 and the insulating layer 41.

Each of the wires 42 corresponding to the respective piezoelectric elements 31 extends rightward or leftward. That is, a direction in which each of the wires 42 extends (hereinafter may be referred to as "wire extending direction") is orthogonal to the nozzle arrangement direction. Specifically, as illustrated in FIG. 3, the wires 42 extend rightward from the respective piezoelectric elements 31 constituting the right two piezoelectric element groups 39k, 39y of the four piezoelectric element groups 39, and the wires 42 extend leftward from the respective piezoelectric elements 31 constituting the left two piezoelectric element groups 39c, 39m of the four piezoelectric element groups 39.

Each of the driving contacts 46 is provided on an end portion of a corresponding one of the wires 42, which end portion is located on an opposite side of the wire 42 from its portion on which the second electrode 34 is disposed. The driving contacts 46 are arranged in a row in the front and rear direction at each of a right end portion and a left end portion of the piezoelectric actuator 22. That is, the direction in which the driving contacts 46 are arranged (hereinafter may also be referred to as "contact arrangement direction") is parallel with the nozzle arrangement direction. In the present embodiment, the nozzles 24 forming the nozzle group 27 of each color are arranged at intervals of 600 dpi (=42 μm). Also, each of the wires 42 extends rightward or leftward from the piezoelectric element 31 corresponding to the nozzle groups 27 associated with corresponding two colors. Accordingly, at each of the right end portion and the left end portion of the piezoelectric actuator 22, the driving contacts 46 are arranged at very short intervals of a half of those of the nozzles 24 of each nozzle group 27, that is, the driving contacts 46 are arranged at the intervals of about 21 μm.

The two ground contacts 47 are respectively disposed in front of and at a rear of the driving contacts 46 arranged in a row in the front and rear direction. Each of the ground contacts 47 has a larger contacting area than each of the driving contacts 46. Each of the ground contacts 47 is connected to the common electrode 36 via a corresponding one of conducting portions 49 (see FIGS. 10A and 10B) which extends through the protecting layer 40 and the insulating layer 41 located just under the ground contact 47.

As described above, the driving contacts 46 and the ground contacts 47 disposed on the right end portion and the left end portion of the piezoelectric actuator 22 are exposed from the protector 23. The two COFs 50 are respectively joined to the right end portion and the left end portion of the piezoelectric actuator 22. Each of the driving contacts 46 is connected to a corresponding one of the driver ICs 51 via a corresponding one of the individual contacts 54 and a corresponding one of the individual wires 52 of the COFs 50. A drive signal is supplied from the driver IC 51 to the driving contacts 46. Each of the ground contacts 47 is connected to a corresponding one of the ground contacts 55 of the COFs 50. A ground potential is applied from the ground contact 55 to the ground contact 47. Detailed constructions of the driving contacts 46 and the ground contacts 47 of the piezoelectric actuator 22 and electric connection of these contacts 46, 47 and the contacts 54, 55 of the COF 50 will be described later.

As illustrated in FIG. 5, the wire protecting layer 43 is disposed so as to cover the wires 42. The wire protecting layer 43 increases insulation between the wires 42. Also, the wire protecting layer 43 inhibits oxidation of a material, e.g., Al, of the wires 42. The wire protecting layer 43 is formed of silicon nitride (SiNx), for example.

As illustrated in FIGS. 5 and 6, in the present embodiment, each of the second electrodes 34 is exposed from the protecting layer 40, the insulating layer 41, and the wire protecting layer 43 except its peripheral portion. That is, deformation of the piezoelectric layers 33 is not hindered by the protecting layer 40, the insulating layer 41, and the wire protecting layer 43.

Joined Portions of Piezoelectric Actuator and COF

There will be next explained a detailed construction of the joined portions of the piezoelectric actuator 22 and each of the COFs 50.

As described above, the driving contacts 46 and the two ground contacts 47 are arranged in the front and rear direction at each of the right end portion and the left end portion of the piezoelectric actuator 22. The end portions of the respective COFs 50 are respectively joined to the right end portion and the left end portion of the piezoelectric actuator 22 with a conductive adhesive 60.

Figure 8A:
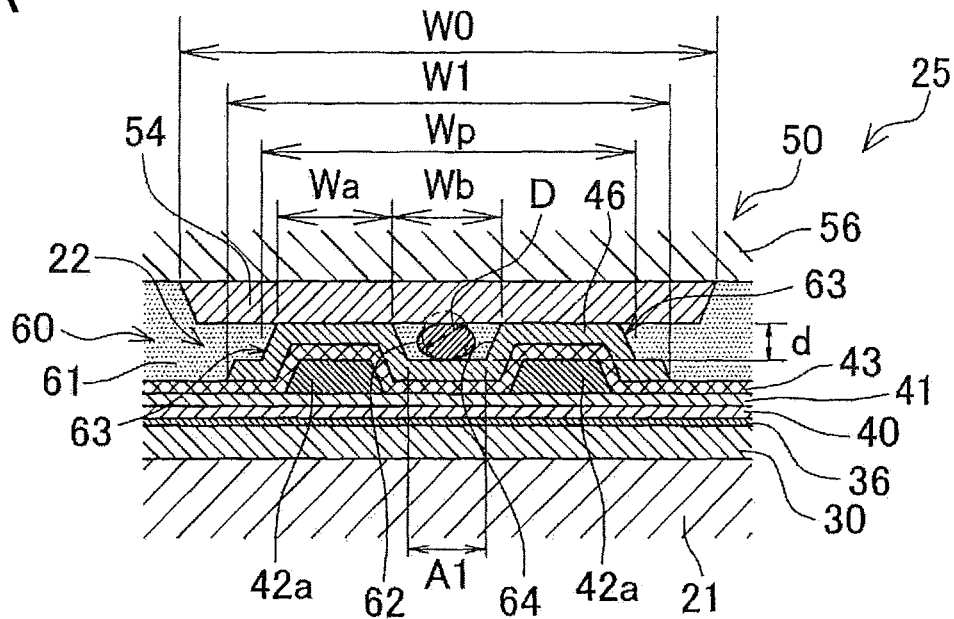
FIG. 8A is a cross-sectional view of joined portions of the piezoelectric actuator and a COF, taken along line A-A in FIG. 7.
Figure 10A:
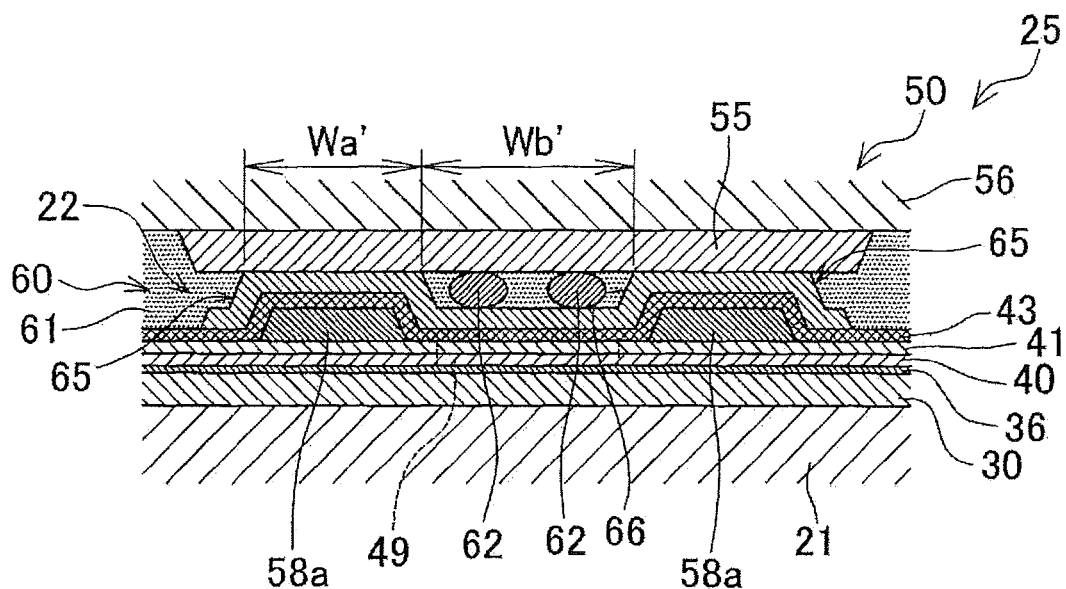
FIG. 10A is a cross-sectional view of the joined portions of the piezoelectric actuator and the COF, taken along line A-A in FIG. 9.

As illustrated in FIGS. 8A and 10A, the conductive adhesive 60 is formed by mixing conductive particles 62 into a thermosetting adhesive 61 formed of epoxy resin, for example. The epoxy resin is used for the thermosetting adhesive 61. Each of the conductive particles 62 is a spherical particle with a diameter D ranged between 3-5 μm, for example. The conductive adhesive 60 is generally used in the form of a film or a paste. One example of the film is an anisotropic conductive film (ACF), and one example of the paste is an anisotropic conductive paste (ACP). The conductive adhesive 60 is provided between the piezoelectric actuator 22 and each of the COFs 50 at an area elongated in the front and rear direction across the contacts 46, 47 (the contacts 54, 55). The COFs 50 are pressed against the piezoelectric actuator 22 in this state while heating the conductive adhesive 60. As a result, the thermosetting adhesive 61 is hardened, so that the piezoelectric actuator 22 and each of the COFs 50 is mechanically joined to each other, and the contacts are electrically connected between the piezoelectric actuator 22 and each of the COFs 50 by the conductive particles 62 contained in the adhesive 60.

In some cases, incidentally, the conductive particles 62 may flow out to areas around the contacts together with the adhesive at heating in the joining using the conductive adhesive 60, leading to poor connection. To improve reliability of electric connection, the present embodiment employs a structure for preventing an outflow of the conductive particles 62 contained in the adhesive 60.

Figure 7:
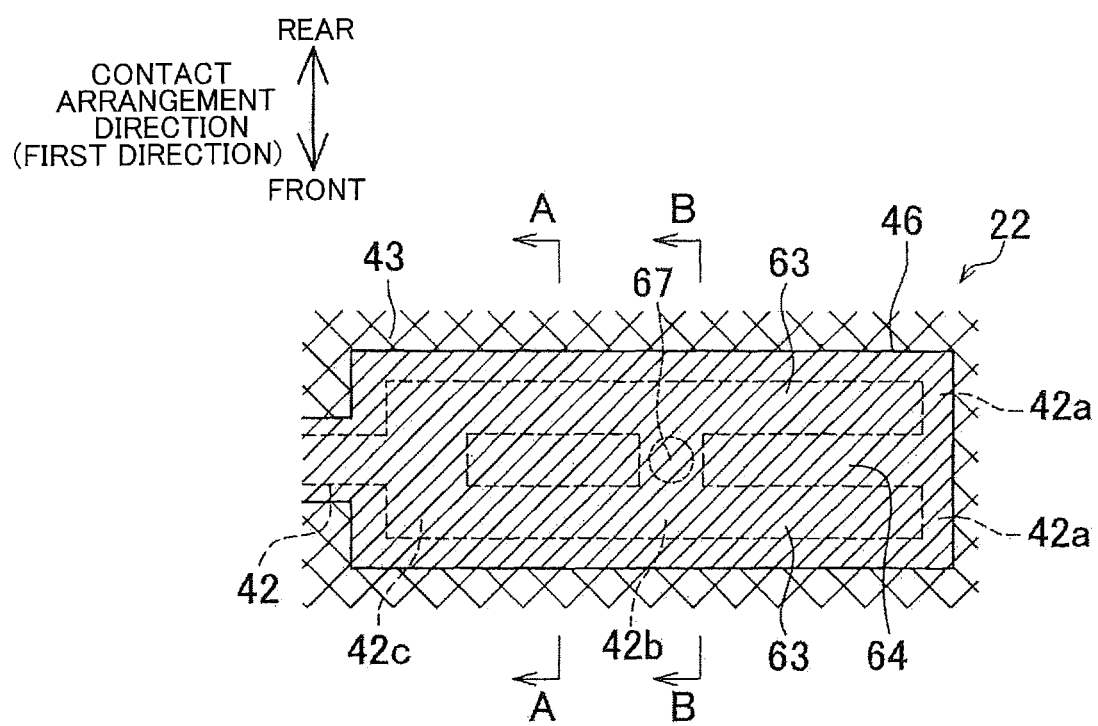
FIG. 7 is a plan view of a driving contact of a piezoelectric actuator.
Figure 8B:
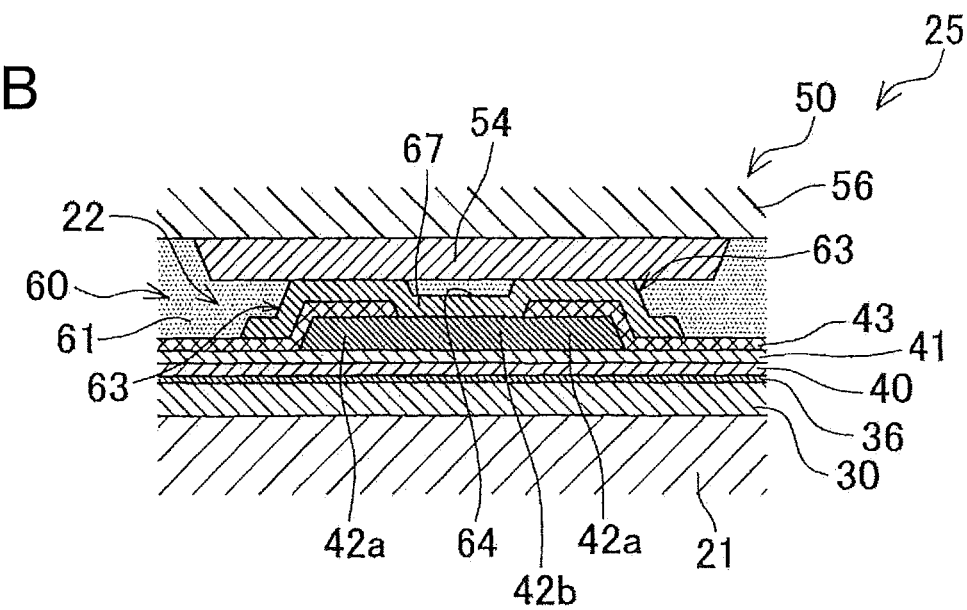
FIG. 8B is a cross-sectional view of the joined portions, taken along line B-B in FIG. 7.

Specifically, as illustrated in FIGS. 7-8B, each of the driving contacts 46 is provided with two protrusions 63 arranged in the front and rear direction and a recess 64 interposed between the two protrusions 63. Each of the protrusions 63 is elongated in the right and left direction. Accordingly, the recess 64 interposed between the two protrusions 63 also has an elongated shape with its length in the right and left direction is longer than its width in the front and rear direction.

Each of the driving contacts 46 is joined to a corresponding one of the individual contacts 54 of the COF 50 with the conductive adhesive 60 located in the recess 64 in a state in which the two protrusions 63 are in direct contact with the individual contact 54 of the COF 50. The conductive particles 62 located in the conductive adhesive 60 are caught by the recess 64 of the driving contact 46, and the contacts 46, 47 conduct each other also by the conductive particles 62 located in the recess 64.

There will be specifically explained constructions of the protrusions 63 and the recess 64 of the driving contact 46. As illustrated in FIGS. 7-8B, a distal end portion of each of the wires 42 extending from the respective second electrodes 34 is bifurcated into two portions. That is, the distal end portion of the wire 42 has two electrically conductive portions 42a spaced apart from in the front and rear direction and each extending in the right and left direction. The two electrically conductive portions 42a are connected to each other by coupling portions 42b, 42c respectively provided at a basal end portion of the driving contact 46 and a central portion of the driving contact 46 in its longitudinal direction. The wire protecting layer 43 covering the wire 42 also covers the two electrically conductive portions 42a.

Each of the driving contacts 46 is formed of, e.g., gold (Au) and overlaps the two electrically conductive portions 42a of the corresponding wire 42 via the wire protecting layer 43. More specifically, each driving contact 46 is disposed so as to overlap the entire two electrically conductive portions 42a and a region located between the two electrically conductive portions 42a. As illustrated in FIG. 8B, the driving contact 46 conducts with the coupling portion 42b by a conducting portion 67 extending through the wire protecting layer 43. That is, the driving contact 46 is connected to the wire 42 via the conducting portion 67, the coupling portion 42b, and the two electrically conductive portions 42a.

In the above-described construction, each of the protrusions 63 is formed by a corresponding one of the electrically conductive portions 42a, a portion of the wire protecting layer 43 which covers the electrically conductive portion 42a, and a portion the driving contact 46 which covers the electrically conductive portion 42a. The recess 64 is formed by a portion of the driving contact 46 which is located between the two electrically conductive portions 42a. As is apparent from FIGS. 8A and 8B, the recess 64 is partially shallow at its region overlapping the coupling portion 42c.

Figure 10B:
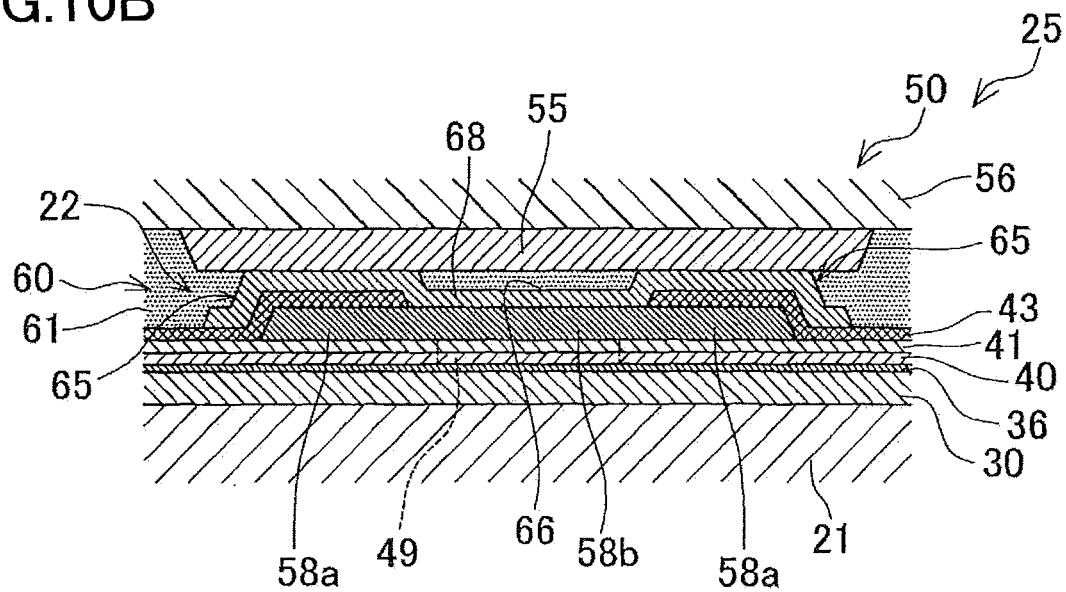
FIG. 10B is a cross-sectional view of the joined portions, taken along line B-B in FIG. 9.
Figure 11A:
FIGS. 11A-11F are views illustrating a first portion of a process of producing the ink-jet head.
Figure 11B:
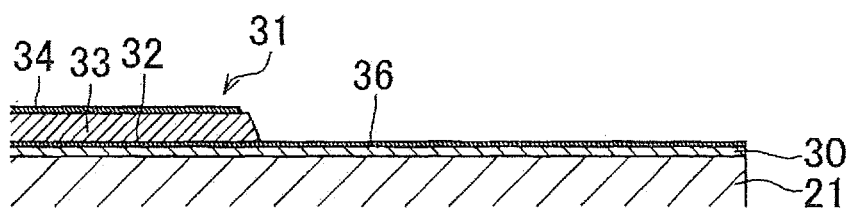
Figure 11C:
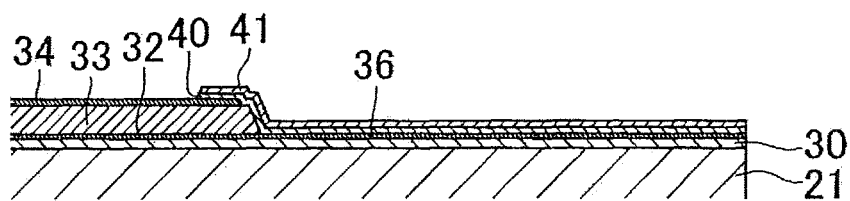
Figure 11D:
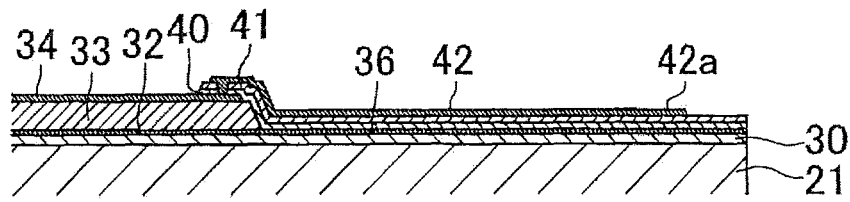
Figure 11E:
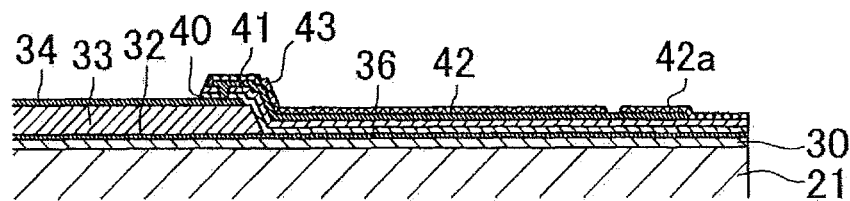
Figure 11F:
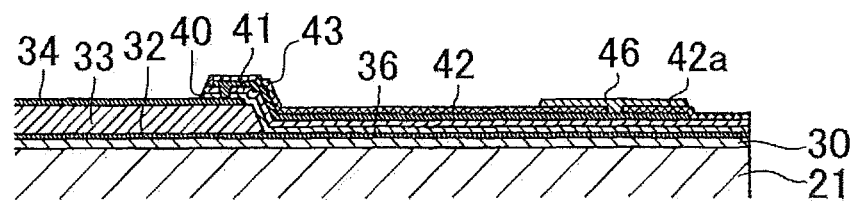
Figure 12G:
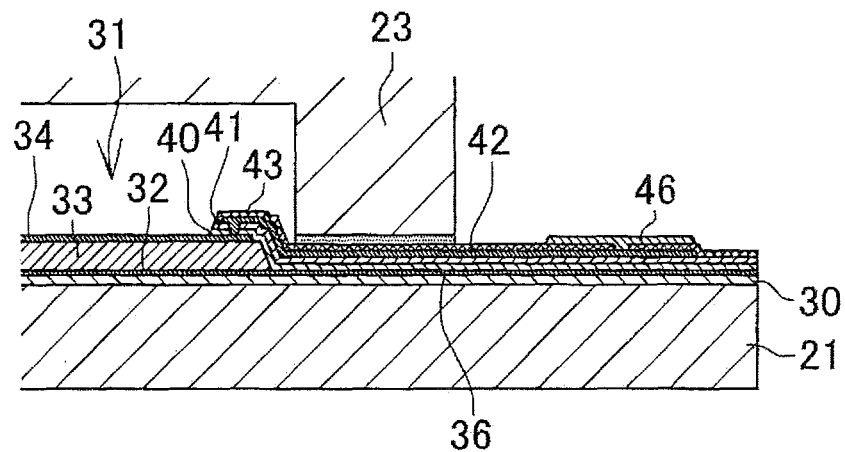
FIGS. 12G-12I are views illustrating a second portion of the process of producing the ink-jet head.
Figure 12H:
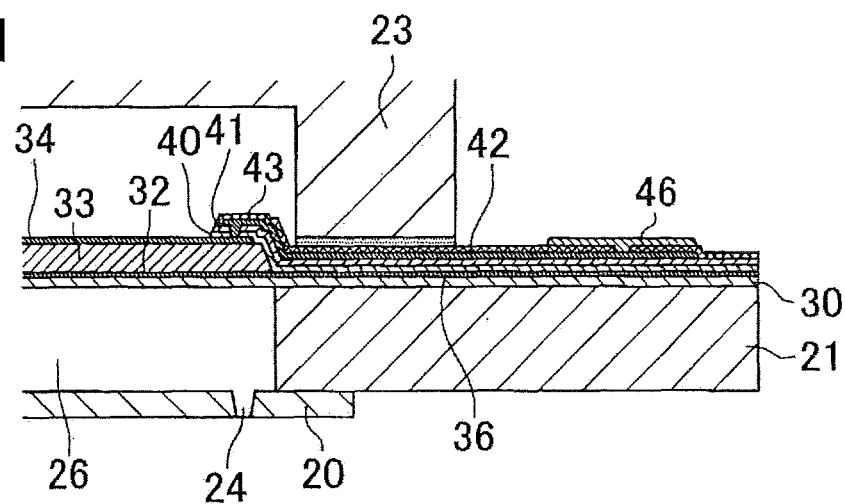
Figure 12I:
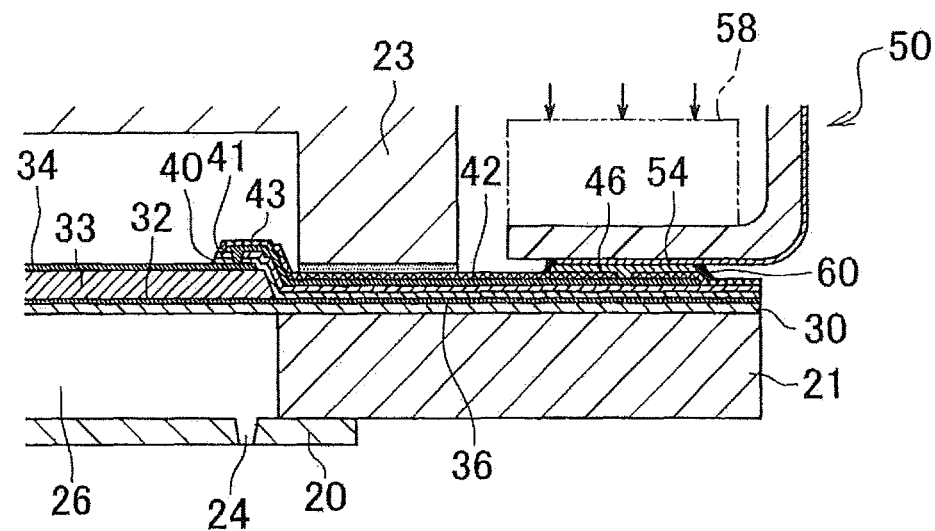

Like the driving contact 46, as illustrated in FIGS. 9-10B, each of the ground contacts 47 includes two protrusions 65 and a recess 66. Each of the ground contacts 47 is joined to a corresponding one of the ground contacts 55 of the COF 50 with the conductive adhesive 60 located in the recess 66 in a state in which the two protrusions 65 are in contact with the ground contact 55 of the COF 50. While the ground contact 47 is a contact with what is called a solid pattern expanding in plan view in FIG. 9, the ground contact 47 may be divided into a plurality of small contacts arranged at the same intervals as those of the driving contacts 46. A strength of joining between the ground contact 47 and the ground contact 55 of the COF 50 is increased by the adhesive 60 having entered regions each between adjacent two of the small contacts.

There will be next explained constructions of the protrusions 65 and the recess 66 of the ground contact 47. Drawn-out wires 58 for the common electrode 36 are formed on the insulating layer 41 with the wires 42. Each of the drawn-out wires 58 conducts with the common electrode 36 located under the protecting layer 40, by a corresponding one of the conducting portions 49 which extends through the insulating layer 41 and the protecting layer 40. Two electrically conductive portions 58a are formed on a distal end portion of each of the drawn-out wires 58. The two electrically conductive portions 58a are connected to each other by coupling portions 58b, 58c. The two electrically conductive portions 58a are also covered with the wire protecting layer 43 on which the ground contact 47 formed of, e.g., gold (Au) is disposed. The ground contact 47 conducts with the coupling portion 58b by a conducting portion 68 extending through the wire protecting layer 43. That is, the ground contact 47 is connected to the common electrode 36 via the conducting portion 68, the coupling portion 58b, the two electrically conductive portions 58a, the drawn-out wires 58, and the conducting portion 49.

In the above-described construction, each of the protrusions 65 is formed by a corresponding one of the electrically conductive portions 58a, a portion of the wire protecting layer 43 which covers the electrically conductive portion 58a, and a portion of the ground contact 47 which covers the electrically conductive portion 58a. The recess 66 is formed by a portion of the ground contact 47 which is located between the two electrically conductive portions 58a.

The area of each of the protrusions 65 of the ground contact 47 is larger than that of each of the protrusions 63 of the driving contact 46. The area of the recess 66 of the ground contact 47 is also larger than the area of the recess 64 of the driving contact 46. Specifically, the width Wa' of the protrusion 65 of the ground contact 47 in the front and rear direction is greater than the width Wa of the protrusion 63 of the driving contact 46 in the front and rear direction. The width Wb' of the recess 66 of the ground contact 47 in the front and rear direction is greater than the width Wb of the recess 64 of the driving contact 46 in the front and rear direction.

As described above, the ground contact 47 is connected to the common electrode 36. A large current may temporarily flow in the common electrode 36 when a plurality of the piezoelectric elements 31 are driven at the same time. In this case, a difference in length among passages connected to the common electrode 36 increases a difference in drop of voltage in the passages connected to the common electrode 36 among the piezoelectric elements 31, resulting in increase in difference in amount of displacement among the piezoelectric elements 31. To suppress this phenomenon, the resistance of the passages connected to the common electrode 36 is preferably made as small as possible. Thus, a resistance of connection between the ground contact 47 and the ground contact 55 is also preferably made small. That is, the area of the protrusion 65 of the ground contact 47 which contacts the ground contact 55 of the COF 50 is preferably large, and the area of the recess 66 of the ground contact 47 in which the conductive particles 62 are caught is also preferably large.

In the present embodiment as described above, each of the driving contacts 46 and the ground contacts 47 has the protrusions and the recess. However, although the contacting area, etc, is different in some degree between the driving contacts 46 and the ground contacts 47, there is no large difference in electric connection between the contacts of the piezoelectric actuator 22 and the contacts of the COF 50. Thus, the following explanation will be provided, taking the driving contacts 46 as an example except cases which requires references to the ground contacts 47, in particular.

There will be explained a process of producing the ink-jet head 4 with reference to FIGS. 11A-12I, mainly focusing on forming of the driving contacts 46 and joining of the COF 50. It is noted that the following steps A-I respectively correspond to FIGS. 11A-12I.

In step A, the vibration layer 30 is formed by performing an oxidation processing or a nitriding processing on a surface of a silicon single crystal base that is to become the passage definer 21. In step B, the first electrodes 32 (the common electrode 36), the piezoelectric layers 33, and the second electrodes 34 are formed on the vibration layer 30 by deposition and etching to form the piezoelectric elements 31. In step C, the protecting layer 40 and the insulating layer 41 are formed so as to cover the piezoelectric layers 33, and patterning is performed by etching.

In step D, the wires 42 formed of, e.g., aluminum (Al) are formed on the insulating layer 41. Specifically, step D is performed by forming an Al layer on the insulating layer 41 and then patterning and etching this Al layer. In this patterning, the two electrically conductive portions 42a are formed on the distal end portion of each wire 42. In step E, the wire protecting layer 43 is formed on the wires 42 and patterned. The wire protecting layer 43 is also formed so as to cover the two electrically conductive portions 42a of the distal end portion of each wire 42. In step F, the driving contacts 46 formed of, e.g., gold (Au) is formed by plating on the wire protecting layer 43 covering the electrically conductive portions 42a. As a result, each of the driving contacts 46 is shaped to have the two protrusions 63 and the recess 64 (see FIGS. 8A and 8B).

In step G, the protector 23 is joined to the piezoelectric actuator 22 so as to cover the piezoelectric elements 31. In step H, the passage definer 21 is polished to reduce its thickness to an appropriate thickness, and then the pressure chambers 26 are formed by etching. In step I, the COF 50 is joined with the conductive adhesive 60 to the end portion of the piezoelectric actuator 22 on which the driving contacts 46 and the ground contacts 47 are disposed. Specifically, the conductive adhesive 60 (ACF or ACP) is provided between the piezoelectric actuator 22 and the COF 50, and then the COF 50 is pressed against the conductive adhesive 60 using a heater plate 58 placed on an upper surface of the COF 50.

This pressing of the COF 50 using the heater plate 58 heats and compresses the conductive adhesive 60 between each of the driving contacts 46 and the corresponding individual contact 54. In this process, as illustrated in FIGS. 8A and 8B, the thermosetting adhesive 61 is partly melted and pushed to an outside from an area located between each pair of contacts, and the two protrusions 63 of each driving contact 46 and the corresponding individual contact 54 of the COF 50 are brought into contact with each other. The thermosetting adhesive 61 is hardened in this state, whereby the COF 50 is mechanically joined to the piezoelectric actuator 22 in a state in which each driving contact 46 and the corresponding individual contact 54 conduct with each other. The conductive particles 62 contained in the conductive adhesive 60 are caught in the recess 64 interposed between the two protrusions 63. With this construction, the number of the conductive particles 62 contained in the conductive adhesive 60 need not be increased so much to catch the conductive particles 62 in the area between the two contacts 46, 47. This construction is particularly effective to increase electric reliability while preventing shorts between adjacent contacts in the construction in which intervals of the arrangement of the driving contacts 46 is very short as in the present embodiment.

In the present embodiment, each driving contact 46 and the corresponding individual contact 54 of the actuator device 25 are in contact with each other in two configurations (i) and (ii). The configuration (i) is direct contact of the protrusions 63 with the individual contacts 54. The configuration (ii) is contact of the conductive particles 62 caught in the recess 64 with the individual contacts 54.

If each driving contact 46 and the corresponding individual contact 54 conduct with each other only in the configuration (i) (the direct contact of the protrusions 63), when a mechanically bonding force of the adhesive 61 is lowered due to time-dependent deterioration of the adhesive 61 around the driving contacts 46, a conduction failure may occur due to separation of the protrusions 63 from the individual contact 54. In this regard, in the present embodiment, conduction is caused not only by the direct contact of the protrusions 63 but also by the conductive particles 62 located in the recess 64. Thus, even if the protrusions 63 are separated from the individual contact 54, the conducting state is maintained by the conductive particles 62. That is, the actuator device has a long useful life with high resistance to the time-dependent deterioration.

If each driving contact 46 and the corresponding individual contact 54 conduct with each other only by the conductive particles 62 as in the configuration (ii), the conduction ceases when the conductive particles 62 flow out from between the two contacts 46, 47. In this regard, in the present embodiment, conduction is caused not only by the direct contact of the protrusions 63 but also by the conductive particles 62, resulting in improved reliability of electric connection. Also, connection resistance is reduced.

In the present embodiment, the following configurations are employed from the viewpoint of improving reliability of electric connection between the contacts.

In the case where the number of the conductive particles 62 contained in the conductive adhesive 60 interposed between the piezoelectric actuator 22 and the COF 50 per area A is defined as n, and the base area of each recess 64 is defined as A1, a relationship "A1≥A/n" is established. In the case where the area of the recess 64 is greater than or equal to the value A/n, one or more conductive particles 62 are held in each recess 64 based on a simple calculation. That is, the conductive particle or particles 62 are more easily caught in the recess 64.

Specifically, in the case where the conductive adhesive 60 is an anisotropic conductive film (ACF), the number of the conductive particles 62 contained in the film per area A only needs to be n. In the case where the conductive adhesive 60 is an anisotropic conductive paste (ACP), the number of the conductive particles 62 contained in the paste per area A in a state in which the paste is applied to the surface of the contact only needs to be n.

As illustrated in FIGS. 8A and 8B, the two protrusions 63 of the driving contact 46 are in contact with the individual contact 54. In this construction, the driving contact 46 is in direct contact with the individual contact 54 at two positions, resulting in improved reliability of conduction. Also, the recess 64 located between the two protrusions 63 is closed by the individual contact 54, making it difficult for the conductive particles 62 to flow out from the recess 64.

The width W0 of the individual contact 54 in the front and rear direction is greater than the width W1 of the driving contact 46 in the front and rear direction for reliable contact of the two protrusions 63 of the driving contact 46 with the individual contact 54. More specifically, the width W0 of the individual contact 54 is preferably greater than or equal to twice the width W1 of the driving contact 46. Even in the case where the width W0 of the individual contact 54 is slightly shorter than the width W1, the individual contact 54 is in reliable contact with the two protrusions 63 in the case where the width W0 is greater than the distance Wp between outer ends of the two protrusions 63 of the driving contact 46.

In the case where the width of the recess 64 is less than the diameter of the conductive particle 62, there is a higher possibility that the conductive particle 62 is pushed out from the recess 64 at joining without being caught in the recess 64. In order to reliably catch the conductive particle 62 in the recess 64, the width Wb of the recess 64 in the front and rear direction is greater than or equal to the diameter D of the conductive particle 62 before joining in the present embodiment. Specifically, the width Wb of the recess 64 is preferably greater than or equal to twice the diameter D of the conductive particle 62. This sufficient width of the recess 64 can catch the conductive particle 62 more reliably. Also, it is possible to catch two or more conductive particles 62 in each recess 64.

In the case where the area of each protrusion 63 is too large with respect to the recess 64 in FIGS. 8A and 8B, the conductive particle 62 may be located on the protrusion 63, making it difficult for the conductive particle 62 to contact the contacts 46, 47 in the recess 64. From this viewpoint, the width Wa of the protrusion 63 is preferably less than the width Wb of the recess 64. This discussion is true to the ground contacts 47 illustrated in FIGS. 10A and 10B, the width Wa' of the protrusion 65 is preferably less than the width Wb' of the recess 66.

If the width Wb of the recess 64 is made too large, the width W1 of the driving contact 46 including the recess 64 is also increased. In this case, a distance between the driving contact 46 and another driving contact 46 next to the driving contact 46 is short, which may lead to shorts therebetween. If the distance is made large in order to prevent shorts, the size of the actuator 22 increases in the front and rear direction. Accordingly, the width Wb of the recess 64 in the front and rear direction is preferably less than or equal to ten times the diameter D of the conductive particle 62. Furthermore, the width W1 of the driving contact 46 in the front and rear direction is also preferably less than or equal to ten times the diameter D of the conductive particle 62.

The conductive particle 62 caught in the recess 64 is preferably compressed between the driving contact 46 and the individual contact 54 and in contact with both of the driving contact 46 and the individual contact 54 by elastic resilience. From this viewpoint, in the present embodiment, the depth d of the recess 64 is less than the diameter D of the conductive particle 62. Specifically, in the case where the depth d of the recess 64 is less than or equal to three fifths of the diameter D of the conductive particle 62, the conductive particle 62 is compressed in an appropriate degree. In FIG. 8A, the two-dot chain line indicates the conductive particle 62 at a time before joining (before compression), and the solid line indicates the conductive particle 62 at a time after joining (after compression). The above-described diameter D of the conductive particle 62 indicates the diameter of the conductive particle 62 before the conductive particle 62 is compressed. In the above-described construction, the conductive particle 62 located in the recess 64 is reliably compressed between the driving contact 46 and the individual contact 54 and reliably in contact with both of the driving contact 46 and the individual contact 54, resulting in increased reliability of electric connection.

However, if the depth d of the recess 64 is too small, the conductive particle 62 easily flows out from the recess 64. Accordingly, the depth d of the recess 64 is preferably greater than or equal to one fifth of the diameter D of the conductive particle 62.

While the relationship between the width Wb of the recess 64 and the diameter D of the conductive particle 62 is described above in relation to the catch of the conductive particle 62, there is another problem in which in the case where the width Wb of the recess 64 is not large enough with respect to the diameter D of the conductive particle 62, when the COF 50 is pressed against the conductive particle 62, the conductive particle 62 cannot be widened laterally and is not easily compressed vertically. That is, the width Wb of the recess 64 is preferably large enough with respect to the diameter of the conductive particle 62 also from the viewpoint of reliably compressing the conductive particle 62. Specifically, the width Wb of the recess 64 is preferably greater than or equal to twice the diameter D of the conductive particle 62.

In the present embodiment, the recess 64 has an elongated shape whose length in the right and left direction is longer than its width in the front and rear direction. Also, only one recess 64 is formed for each of the driving contacts 46 in the front and rear direction. With these constructions, the width Wb of the recess 64 is short in the front and rear direction in which the driving contacts 46 are arranged, so that the width W1 of the driving contact 46 is small. Since the recess 64 is long in the right and left direction, it is possible to catch many conductive particles 62 in the recess 64. Also, although the recess 64 is formed in each of the driving contacts 46, intervals at which the driving contacts 46 are arranged can be made short. In particular, the present embodiment employs the above-described construction because the driving contacts 46 need to be arranged in a row though the nozzles 24 of the two nozzle groups 27 corresponding to the driving contacts 46 are arranged at the high density of 600 dpi.

In the present embodiment, the driving contact 46 of the piezoelectric actuator 22 is formed with the protrusions 63 and the recess 64. However, effects similar to the above-described effects are obtained even in a construction in which protrusions and a recess are formed on and in each of the individual contacts 54 of the COF 50. However, forming of the protrusions and the recess on and in each of the contacts requires patterning at intervals shorter than the intervals at which the contacts are arranged. Specifically, in the present embodiment, the two electrically conductive portions 42a for forming the two protrusions 63 are formed on the distal end portion of each of the wires 42. The two electrically conductive portions 42a are formed at a considerably small distance of a half of the intervals in which the wires 42 are arranged.

Focusing on achieving fine pitches, patterning is in general more easily performed on a silicon single crystal base than a wire base such as the COF 50 at the current technological level. That is, fine patterns are more easily formed on the silicon base than on the wire base. Accordingly, if the recess and the protrusions may be formed in and on any of each contact of the piezoelectric actuator 22 and each contact of the COF 50, the protrusions 63 and the recess 64 are more easily formed on and in each of the driving contacts 46 of the piezoelectric actuator 22.

As described in the explanation for the producing process, each wire 42 having the two electrically conductive portions 42a is formed of aluminum (Al) and patterned by etching of the Al layer in the present embodiment. The patterning using etching enables formation of wire patterns at a high definition. In contrast, the driving contacts 46 are formed of gold (Au) and are generally formed by plating. The precision of patterning by plating is less than that of patterning by etching. That is, in the present embodiment, the driving contact 46 formed of a material unsuitable for fine pitches is formed over the electrically conductive portions 42a formed by etching at fine pitches, whereby the two protrusions 63 and the recess 64 are formed.

However, aluminum is subject to oxidation when compared with gold. Thus, in the present embodiment, the two electrically conductive portions 42a are covered with the wire protecting layer 43, and the driving contact 46 is formed thereon. This construction inhibits oxidation of the electrically conductive portions 42a.

In the embodiment described above, the ink-jet head 4 is one example of a liquid ejection apparatus. The piezoelectric actuator 22 is one example of an actuator. The front and rear direction, i.e., each of the nozzle arrangement direction and the contact arrangement direction is one example of a first direction. The right and left direction, i.e., the wire extending direction parallel with the upper surface of the piezoelectric actuator 22 on which the contacts 46 are disposed and orthogonal to the contact arrangement direction is one example of a second direction. The COF 50 is one example of a wire member. Each of the driving contacts 46 and the ground contacts 47 of the piezoelectric actuator 22 is one example of a first contact. Each of the individual contacts 54 and the ground contacts 55 of the COF 50 is one example of a second contact. The wire protecting layer 43 covering the two electrically conductive portions 42a is one example of an insulating layer.

There will be next explained modifications of the embodiment. It is noted that the same reference numerals as used in the above-described embodiment are used to designate the corresponding elements of the modifications, and an explanation of which is dispensed with.

In the above-described embodiment, each of the driving contacts 46 and the ground contacts 47 of the piezoelectric actuator 22 has the protrusions and the recess. However, only one of each of the driving contacts 46 and each of the ground contacts 47 may have the protrusions and the recess.

In the above-described embodiment, the three insulating layers, namely, the protecting layer 40, the insulating layer 41, and the wire protecting layer 43, are formed on the piezoelectric layers 33, but these layers may be removed as needed. For example, in the case where the wires connected to the second electrodes 34 are formed of a highly stable material such as gold (Au), the insulating layer 41 and the protecting layer 43 may not be provided.

The shapes of the protrusions and the recess formed on and in each contact are not limited to those in the above-described embodiment. For example, the following first-fourth modifications may be provided.

In the first modification, three or more protrusions and two or more recesses may be formed on and in each contact. Increase in the number of protrusions increases the direct contact area, resulting in higher reliability of electric connection. Also, the connection resistance is reduced. Furthermore, increase in the number of recesses increases the number of the conductive particles 62 to be caught, resulting in higher reliability of electric connection.

Figure 13A:
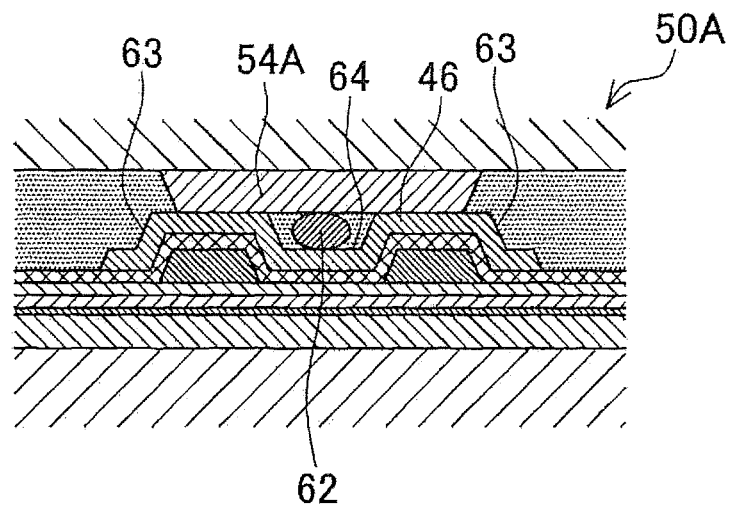
FIGS. 13A and 13B are cross-sectional views each illustrating joined portions of a piezoelectric actuator and a COF of an ink-jet head in a corresponding modification.
Figure 13B:
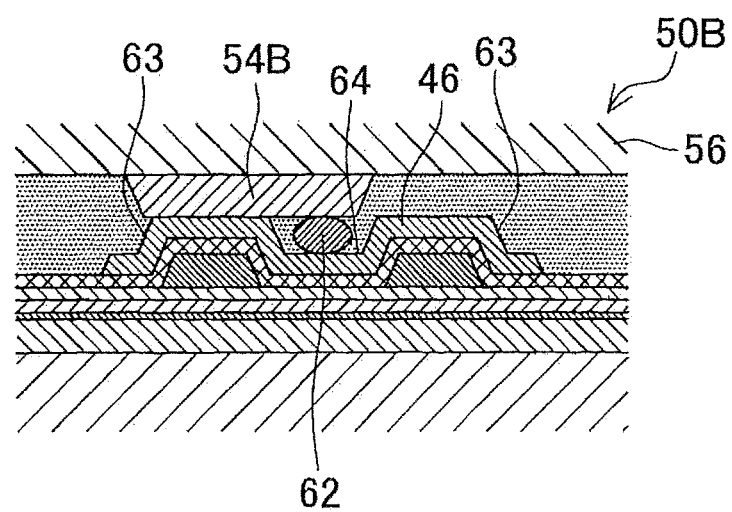

In the above-described embodiment, as illustrated in FIGS. 8A and 8B, the width of the individual contact 54 of the COF 50 is greater than the width of the driving contact 46 of the piezoelectric actuator 22. In a second modification, as illustrated in FIG. 13A, the width of an individual contact 54A of the COF 50A may be less than that of the driving contact 46 of the piezoelectric actuator 22. Alternatively, as illustrated in FIG. 13B, only one of the two protrusions 63 of the driving contact 46 may be in contact with the individual contact 54B. Also in this construction, most of the recess 64 located between the two protrusions 63 is closed by a COF 50B, making it difficult for the conductive particles 62 to flow out from the recess 64.

In the above-described embodiment, the depth of the recess 64 is less than the diameter of the conductive particle 62. In a third modification, however, the depth of the recess may be greater than the diameter of the conductive particle 62. Also in this construction, it is possible to compress the conductive particles 62 in the recess as long as two or more conductive particles 62 are caught in the recess.

In the above-described embodiment, as illustrated in FIG. 7, no protrusion is formed to the right of the recess 64 (i.e., on one of opposite sides of the recess 64 which is located nearer to a distal end of the contact 46 than the other), and a right end of the recess 64 is open. In a fourth modification, however, a protrusion may be formed on one of opposite sides of the recess which is located nearer to a distal end of the contact than the other. In this construction, the recess is surrounded by the protrusions, making it difficult for the conductive particles to flow out from the recess.

While the two protrusions 63 are formed by the bifurcated shape of the distal end portion of the wire 42 in the above-described embodiment, protrusions and a recess may be formed on and in the contact in other methods.

Figure 14A:
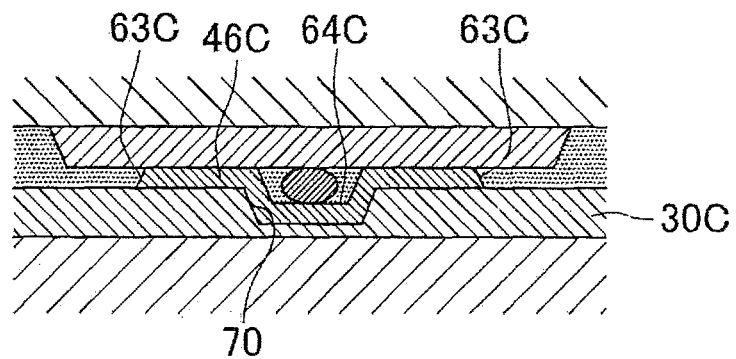
FIGS. 14A-14D are cross-sectional views each illustrating joined portions of a piezoelectric actuator and a COF of an ink-jet head in a corresponding modification.

In a modification illustrated in FIG. 14A, a recessed layer portion 70 is formed by etching an upper surface of a vibration layer 30C. A driving contact 46C is disposed so as to cover the recessed layer portion 70. In this construction, a portion of the driving contact 46C which overlaps the recessed layer portion 70 serves as a recess 64C. Protrusions 63C are constituted by (i) portions of the vibration layer 30C which are located in front of and at a rear of the layer portion 70 and (ii) portions of the driving contact 46C which are respectively located just above the portions of the vibration layer 30C.

Figure 14B:
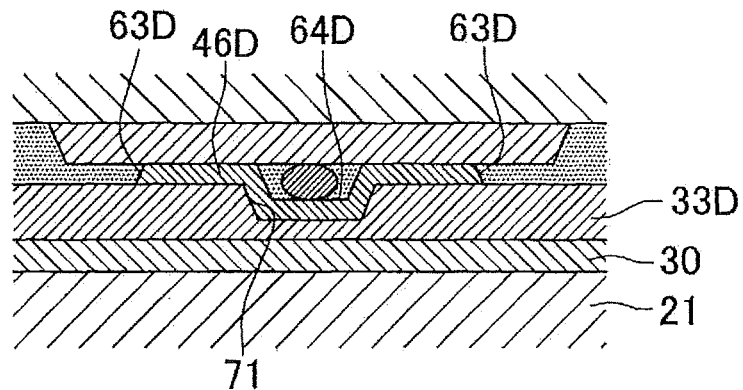

FIG. 14B illustrates yet another modification in which a recessed layer portion is formed by etching the piezoelectric layer instead of the vibration layer. In this modification, a piezoelectric layer 33D located over the vibration layer 30 extends to an end portion of the passage definer 21. The piezoelectric layer 33D is etched to form a recessed layer portion 71. A driving contact 46D is disposed so as to cover the recessed layer portion 71. In this construction, a portion of the driving contact 46D which overlaps the recessed layer portion 71 serves as a recess 64D. Protrusions 63D are constituted by (i) portions of the piezoelectric layer 33D which are located in front of and at a rear of the layer portion 71 and (ii) portions of the driving contact 46D which are respectively located just above the portions of the piezoelectric layer 33D.

Figure 14C:
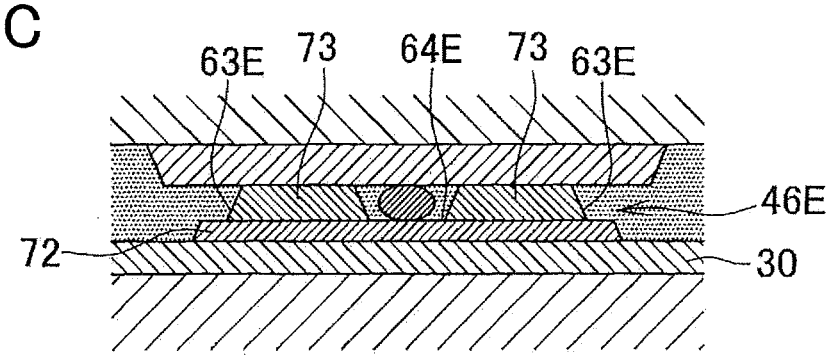

FIG. 14C illustrates yet another modification in which a driving contact 46E disposed on the vibration layer 30 includes a conductive layer 72 and two conductors 73. The two conductors 73 are disposed on the conductive layer 72 so as to be spaced apart from each other in the front and rear direction. In this modification, protrusions 63E are constituted by the conductors 73 and portions of the conductive layer 72 which are located just below the respective conductors 73. A portion of the conductive layer 72 which is interposed between the two conductors 73 serves as a recess 64E.

Figure 14D:
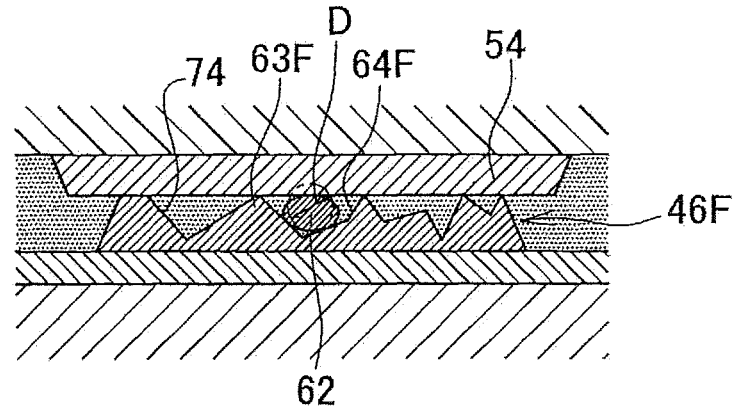

FIG. 14D illustrates yet another modification in which etching, plasma processing, and/or other similar processings may be performed on a surface of a driving contact 46F, to which the individual contact 54 is connected, such that the driving contact 46F has a rough surface 74 with a surface roughness enough to catch the conductive particles 62. For example, a desired surface roughness of the surface of the driving contact may be achieved by changes of an etch rate of wet etching (see Japanese Patent Application Publication No. 2012-222025).

Protrusions 63F and recesses 64F having various shapes are formed on and in the rough surface 74. The surface roughness (arithmetic average roughness) Ra of the rough surface 74 is preferably less than the diameter D of the conductive particle 62 in order to compress the conductive particles 62 in the recesses 64F of the rough surface 74. If the surface roughness Ra is too small, the recesses 64F cannot catch the conductive particles 62. Thus, the surface roughness Ra is preferably greater than or equal to one fifth of the diameter D of the conductive particle 62.

In the above-described embodiment, the two protrusions 63 of each of the driving contacts 46 are arranged in the front and rear direction coinciding with the direction in which the driving contacts 46 are arranged. However, two or more protrusions may be arranged in a direction orthogonal to the direction in which the driving contacts are arranged. In this construction, the width of each of the contacts in the contact arrangement direction is large in many cases, leading to increase in intervals at which the contacts are arranged. However, the larger width of each contact results in higher peel strength of the COF.

Figure 15:
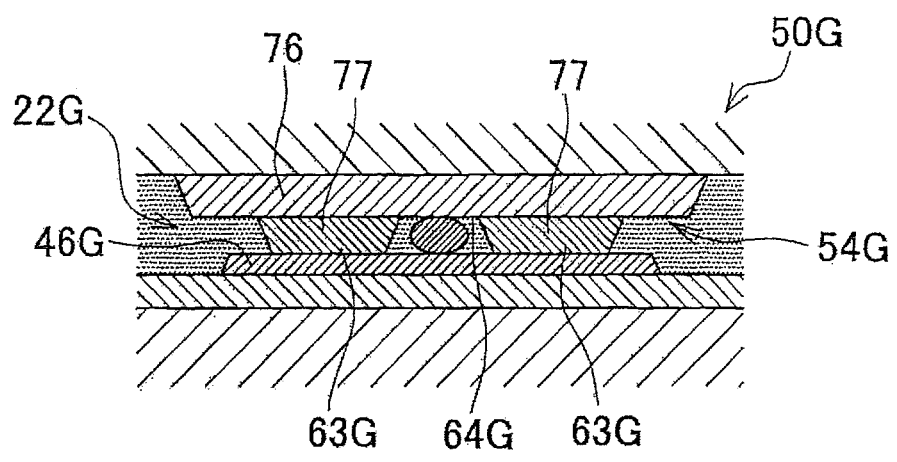
FIG. 15 is a cross-sectional view illustrating joined portions of a piezoelectric actuator and a COF of an ink-jet head in another modification.

In the above-described embodiment, the protrusions 63 and the recess 64 are formed on and in each of the driving contacts 46 of the piezoelectric actuator 22, but protrusions and a recess are formed on and in each contact of the COF. For example, in a modification illustrated in FIG. 15, an individual contact 54G of a COF 50G which is connected to a driving contact 46G of a piezoelectric actuator 22G includes a conductive layer 76 and two conductors 77. The two conductors 77 are disposed on the conductive layer 76 so as to be spaced apart from each other in the front and rear direction. In this construction, protrusions 63G are constituted by the conductors 77 and portions of the conductive layer 76 which are located just below the respective conductors 77. Also, a portion of the conductive layer 76 which is located between the two conductors 77 serves as a recess 64G.

The arrangement of the driving contacts and the ground contacts in one ink-jet head is not limited to the arrangement in the above-described embodiment. For example, the ink-jet head may be configured such that all the wires of the piezoelectric elements are drawn in one direction, and all the driving contacts are arranged in a row at one end portion of the piezoelectric actuator. The ink-jet head may be configured such that all the wires of the piezoelectric elements are drawn toward a central portion of the piezoelectric actuator in the scanning direction, and all the driving contacts are arranged in a row at the central portion of the piezoelectric actuator. The number of the ground contacts is not limited to two and may be one, or three or more.

The ink-jet head 4 in the above-described embodiment is a serial head configured to eject the ink while moving in the widthwise direction of the recording sheet 100. However, the present disclosure may be applied to a line head having nozzles arranged in the widthwise direction of the sheet.

While the present disclosure is applied to the ink-jet head configured to eject the ink onto the recording sheet to record an image in the above-described embodiment, the present disclosure may be applied to actuator devices used for purposes other than liquid ejection. Also, the actuator is not limited to the piezoelectric actuator including a plurality of piezoelectric elements. For example, the actuator may be an actuator including a heater as a drive element which causes driving by utilizing a heat generated when a current passes through the heater.

What is claimed is:

1. A head, comprising:
    an actuator comprising at least one first contact
    wherein at least two protrusions and at least one recess are formed on and in the at least one first contact, the at least two protrusions being arranged in a first direction parallel with a placement surface of each of the at least one first contact, the at least one recess being interposed between the at least two protrusions, and
    wherein a plurality of first contacts as the at least one first contact are arranged at an interval of less than or equal to 21 μm.

2. The head according to claim 1, wherein the actuator comprises a piezoelectric layer with a thickness between 1.0 μm and 2.0 μm.

3. The head according to claim 1, further comprising a wire member comprising at least one second contact respectively connected to the at least one first contact,
    wherein one of (i) each of the at least one first contact and (ii) each of the at least one second contact is each of at least one particular contact, and another of (i) each of the at least one first contact and (ii) each of the at least one second contact is each of at least one specific contact,
    wherein the at least two protrusions and the at least one recess are formed on and in the at least one particular contact, the at least two protrusions being arranged in the first direction parallel with the placement surface of each of the at least one particular contact, and wherein the at least one particular contact is respectively joined to the at least one specific contact in a state in which each of the at least two protrusions is in contact with a corresponding one of the at least one specific contact.

4. The head according to claim 3, wherein each of the at least two protrusions is in contact with a corresponding one of the at least one specific contact.

5. The head according to claim 4, wherein a width of each of the at least one specific contact in the first direction is greater than a width of each of the at least one particular contact in the first direction.

6. The head according to claim 5, wherein the width of each of the at least one specific contact in the first direction is greater than or equal to twice the width of each of the at least one particular contact in the first direction.

7. The head according to claim 1, wherein the at least one first contact and the at least one second contact are bonded to each other with a conductive adhesive.

8. The head according to claim 7, wherein the conductive adhesive comprises a conductive particle with a diameter between 3 μm and 5 μm.

9. The head according to claim 8, wherein where n is the number of conductive particles contained in the conductive adhesive per area A, and Al is an area of each of the at least one recess, Al is greater than or equal to A/n.

10. The head according to claim 8, wherein a width of each of the at least one recess in the first direction is greater than or equal to a diameter of the conductive particle.

11. The head according to claim 10, wherein the width of each of the at least one recess in the first direction is greater than or equal to twice the diameter of the conductive particle.

12. The head according to claim 10, wherein the width of each of the at least one recess in the first direction is less than or equal to ten times the diameter of the conductive particle.

13. The head according to claim 12, wherein a width of each of the at least one particular contact in the first direction is less than or equal to ten times the diameter of the conductive particle.

14. The head according to claim 8, wherein a depth of each of the at least one recess is less than a diameter of the conductive particle.

15. The head according to claim 14, wherein the depth of each of the at least one recess is less than or equal to three fifths of the diameter of the conductive particle.

16. The head according to claim 14, wherein the depth of each of the at least one recess is greater than or equal to one fifth of the diameter of the conductive particle.

17. The head according to claim 1,
wherein a length of each of the at least one recess in a second direction parallel with the placement surface and orthogonal to the first direction is greater than that of each of the at least one recess in the first direction.

18. The head according to claim 17, wherein only one of the at least one recess is disposed in the first direction.

* * * * *